(12) United States Patent
Zhu et al.

(10) Patent No.: US 10,910,569 B2
(45) Date of Patent: Feb. 2, 2021

(54) ORGANO-METAL HALIDE PEROVSKITES FILMS AND METHODS OF MAKING THE SAME

(71) Applicants: Alliance for Sustainable Energy, LLC, Golden, CO (US); Brown University—Technology Ventures Office, Providence, RI (US)

(72) Inventors: Kai Zhu, Littleton, CO (US); Mengjin Yang, Dallas, TX (US); Yuanyuan Zhou, Providence, RI (US); Nitin Prabhakar Padture, Providence, RI (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 15/574,611

(22) PCT Filed: May 18, 2016

(86) PCT No.: PCT/US2016/033135
§ 371 (c)(1),
(2) Date: Nov. 16, 2017

(87) PCT Pub. No.: WO2016/187340
PCT Pub. Date: Nov. 24, 2016

(65) Prior Publication Data
US 2018/0151813 A1    May 31, 2018

Related U.S. Application Data

(60) Provisional application No. 62/163,451, filed on May 19, 2015.

(51) Int. Cl.
*H01L 51/00* (2006.01)
*H01L 51/42* (2006.01)

(52) U.S. Cl.
CPC ...... *H01L 51/0077* (2013.01); *H01L 51/0007* (2013.01); *H01L 51/0026* (2013.01);
(Continued)

(58) Field of Classification Search
CPC .. H01L 51/0003; H01L 51/001; H01L 31/032
(Continued)

(56) References Cited

U.S. PATENT DOCUMENTS

2014/0332078 A1    11/2014  Guo et al.
2016/0035917 A1 *  2/2016   Gershon ............... H01L 51/001
                                                        136/252

(Continued)

FOREIGN PATENT DOCUMENTS

WO    WO 2013/171518 A1    11/2013
WO       2014/045021 A1     3/2014
WO    WO 2014202965 A1 *   12/2014   ............. H01L 51/00

OTHER PUBLICATIONS

Jung, J. et al., "Low-temperature processed high-performance flexible perovskite solar cells via rationally optimized solvent washing treatments," RSC Advances, 2014, vol. 4, pp. 62971-62977.
(Continued)

*Primary Examiner* — Khanh T Nguyen
(74) *Attorney, Agent, or Firm* — Michael A. McIntyre

(57) ABSTRACT

An aspect of the present disclosure is a method that includes applying a solution that includes a first solvent, a halogen-containing precursor, and a metal halide to a substrate to form a coating of the solution on the substrate, contacting the coating with a second solvent to form a first plurality of organo-metal halide perovskite crystals on the substrate, and thermally treating the first plurality of organo-metal halide perovskite crystals, such that at least a portion of the first plurality of organo-metal halide perovskite crystals is converted to a second plurality of organo-metal halide perov-
(Continued)

skite crystals on the substrate. The halogen-containing precursor and the metal halide are present in the solution at a molar ratio of the halogen-containing precursor to the metal halide between about 1.01:1.0 and about 2.0:1.0, and a property of the second plurality of organo-metal halide perovskite crystals is improved relative to a property of the first plurality of organo-metal halide perovskite crystals.

21 Claims, 24 Drawing Sheets

(52) U.S. Cl.
CPC ......... *H01L 51/4226* (2013.01); *Y02E 10/549* (2013.01); *Y02P 70/50* (2015.11)

(58) Field of Classification Search
USPC .................................................. 136/252, 263
See application file for complete search history.

(56) References Cited

U.S. PATENT DOCUMENTS

| | | | |
|---|---|---|---|
| 2016/0141535 A1* | 5/2016 | Snaith ................ | H01L 51/0003 136/263 |
| 2016/0322591 A1* | 11/2016 | Seok .................. | H01L 51/0003 |
| 2017/0186559 A1 | 6/2017 | Zhu et al. | |

OTHER PUBLICATIONS

Xiao, Z. et al., "Solvent Annealing of Perovskite-Induced Crystal Growth for Photovoltaic-Device Efficiency Enhancement," Advanced Materials, 2014, vol. 26, pp. 6503-6509.
European Extended Search Report dated Dec. 7, 2018, 13 pages.
Chen, Q. et al., "Controllable Self-Induced Passivation of Hybrid Lead Iodide Perovskites toward High Performance Solar Cells," Nano Letters, vol. 14, 2014, pp. 4158-4163.
Huang, F. et al., "Gas-assisted preparation of lead iodide perovskite films consisting of a monolayer of single crystalline grains for high efficiency planar solar cells," Elsevier Nano Energy, vol. 10, 2014, pp. 10-18.
Jeon, N. et al., "Solvent engineering for high-performance inorganic-organic hybrid perovskite solar cells," Nature Materials, vol. 13, Jul. 6, 2014, pp. 897-903.
Lee, M. et al., "Efficient Hybrid Solar Cells Based on Meso-Superstructured Organometal Halide Perovskites," Science, vol. 338, Nov. 2, 2012, pp. 643-647.
Xiao, Z. et al., "Efficient, high yield perovskite photovoltaic devices grown by interdiffusion of solution-processed precursor stacking layers," Energy & Environmental Science, vol. 7, 2014, pp. 2619-2623.
Xiao, M. et al., "A Fast Deposition-Crystallization Procedure for Highly Efficient Lead Iodide Perovskite Thin-Film Solar Cells," Angewandte Communications, vol. 53, 2014, pp. 9898-9903.
Yang, M. et al., "Improved charge transport of Nb-doped TiO2 nanorods in methylammonium lead iodide bromide perovskite solar cells," Journal of Materials Chemistry A, vol. 2, 2014, pp. 19616-19622.
Zhao, Y. et al., "$CH_3NH_3Cl$-Assisted One-Step Solution Growth of $CH_3NH_3PbI_3$: Structure, Charge-Carrier Dynamics, and Photovoltaic Properties of Perovskite Solar Cells," Journal of Physical Chemistry C, vol. 118, 2014, pp. 9412-9418.
Zhou, Y. et al., "Room-temperature crystallization of hybrid-perovskite thin films via solvent-solvent extraction for high-performance solar cells," Journal of Materials Chemistry A, vol. 3, 2015, pp. 8178-8184.
Zhou, Y. et al., "Growth control of compact $CH_3NH_3PbI_3$ thin films via enhanced solid-state precursor reaction for efficient planar perovskite solar cells," Journal of Materials Chemistry A, vol. 3, 2015, pp. 9249-9256.
Search Report from corresponding PCT patent application, PCT/US16/33135, dated Aug. 23, 2016, three pages.
Written Opinion from corresponding PCT patent application PCT/US16/33135, dated Aug. 23, 2016, five pages.
Zhang, T. et al., "Controllable Sequential Deposition of Planar CH3NH3PbI3 Perovskite Films via Adjustable Volume Expansion," Nano Letters, vol. 15, 2015, 5 pages.
Zhao, Y. et al., "Efficient Planar Perovskite Solar Cells Based on 1.8 eV Band Gap CH3NH3PbI2Br Nanosheets via Thermal Decomposition," Journal of the American Chemical Society, vol. 136, 2014, 4 pages.
Zhao, Y. et al., "Three-step sequential solution deposition of PbI2-free CH3NH3PbI3 perovskite," Journal of Materials Chemistry A, vol. 3, 2015, 6 pages.
Burschka, J. et al., "Sequential deposition as a route to high-performance perovskite-sensitized solar cells," Nature, vol. 499, 2013, 5 pages.
Gao, J. et al., "n-Type Transition Metal Oxide as a Hole Extraction Layer in PbS Quantum Dot Solar Cells," Nano Letters, vol. 11, 2011, 4 pages.
Tan, K.W. et al., "Thermally Induced Structural Evolution and Performance of Mesoporous Block Copolymer-Directed Alumina Perovskite Solar Cells," vol. 8, No. 5, 2014, 10 pages.
Tao, C. et al., "Performance improvement of inverted polymer solar cells with different top electrodes by introducing a MoO3 buffer layer," Applied Physics Letters, vol. 93, 2008, 3 pages.
European Extended Search Report dated Nov. 26, 2019, 8 pages.
Wang, Qi, et al., Energy Environ. Sci., 2014, 7, 2359-2365.

* cited by examiner

ORGANO-METAL HALIDE PEROVSKITES FILMS AND METHODS OF MAKING THE SAME

CROSS-REFERENCE TO RELATED APPLICATIONS

This application claims priority under 35 U.S.C. § 371 to PCT Patent Application No. PCT/US16/33135, filed on May 18, 2016, which claims the benefit of U.S. Provisional Application No. 62/163,451 filed May 19, 2015, the contents of which are incorporated herein by reference in their entirety.

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Organo-metal halide perovskites (e.g. $CH_3NH_3PbI_3$ [abbreviated as $MAPbI_3$]) have been rapidly developing since their first application to solar cells in 2009. Perovskite solar cell certified power conversion efficiencies (PCEs) exceeded 20% in 2014. However, this level of performance is typically for small area perovskite devices, typically about 0.1 $cm^2$, but sometimes even as small as 0.03 $cm^2$. However, larger area devices are required to for economical implementation of organo-metal halide perovskite solar cells in actual industrial, commercial, and/or residential applications.

SUMMARY

An aspect of the present disclosure is a method that includes applying a solution that includes a first solvent, a halogen-containing precursor, and a metal halide to a substrate to form a coating of the solution on the substrate, contacting the coating with a second solvent to form a first plurality of organo-metal halide perovskite crystals on the substrate, and thermally treating the first plurality of organo-metal halide perovskite crystals, such that at least a portion of the first plurality of organo-metal halide perovskite crystals is converted to a second plurality of organo-metal halide perovskite crystals on the substrate. The halogen-containing precursor and the metal halide are present in the solution at a molar ratio of the halogen-containing precursor to the metal halide between about 1.01:1.0 and about 2.0:1.0, and a property of the second plurality of organo-metal halide perovskite crystals is improved relative to a property of the first plurality of organo-metal halide perovskite crystals.

In some embodiments of the present disclosure, the first plurality of organo-metal halide perovskite crystals may form as a film on the substrate. In some embodiments of the present disclosure, the first solvent may have a boiling point temperature greater than about 150° C. In some embodiments of the present disclosure, the first solvent may include at least one of 1-methyl-2-pyrrolidinone, γ-butyrolactone, and/or dimethyl sulfoxide. In some embodiments of the present disclosure, the halogen-containing precursor may include at least one of a methylammonium halide, a formamidinium halide, and/or a cesium iodide.

In some embodiments of the present disclosure, the methylammonium halide may include methylammonium iodide (MAI). In some embodiments of the present disclosure, the methylammonium halide may include at least one of methylammonium iodide (MAI) and/or methylammonium chloride (MACl). In some embodiments of the present disclosure, the methylammonium halide may include MAI and MACl, a molar ratio of the MAI to the metal halide may be about 1.0:1.0, and a molar ratio of the MACl to the metal halide may be between about 0.01:1.0 and about 1.0:1.0. In some embodiments of the present disclosure, the metal halide may include at least one of $PbI_2$, $SnI_2$, $BiI_3$, and/or $InI_3$.

In some embodiments of the present disclosure, the second solvent may have a boiling point temperature below about 150° C. In some embodiments of the present disclosure, the second solvent may include at least one of diethyl ether, toluene, chlorobenzene, and/or hexane. In some embodiments of the present disclosure, the applying may include at least one of spin-coating, curtain-coating, dip-coating, and/or spraying the solution onto a surface of the substrate. In some embodiments of the present disclosure, the applying may be performed at a temperature between about 0° C. and about 35° C. In some embodiments of the present disclosure, the applying may be performed over a period of time between about 1 second and about 1 hour.

In some embodiments of the present disclosure, the contacting may include immersing the coating and the substrate in the second solvent. In some embodiments of the present disclosure, the immersing may be performed for a period of time between about 30 seconds and about 1 hour. In some embodiments of the present disclosure, the thermally treating may include heating the first plurality of organo-metal halide perovskite crystals to a temperature between about 35° C. and about 200° C. In some embodiments of the present disclosure, the thermally treating may be performed for a period of time between about 5 seconds and about 1 hour. In some embodiments of the present disclosure, the thermally treating may be performed in an oxygen-containing environment. In some embodiments of the present disclosure, the second plurality of organo-metal halide perovskite crystals may include an alkylammonium metal halide crystal. In some embodiments of the present disclosure, the alkylammonium metal halide crystal may include a methylammonium lead iodide crystal. In some embodiments of the present disclosure, the property of the second plurality of organo-metal halide perovskite crystals may be an average crystal size having a value greater than about 1 micrometer.

An aspect of the present disclosure is a composition that includes a plurality of methylammonium lead iodide crystals, where the plurality of methylammonium lead iodide crystals has an average crystal size greater than about 1 micrometer, and at least a portion of the plurality of methylammonium lead iodide crystals is aligned relative to a reference axis.

DRAWINGS

Some embodiments are illustrated in referenced figures of the drawings. It is intended that the embodiments and figures disclosed herein are to be considered illustrative rather than limiting.

3A) and of a final organo-metal halide perovskite film after thermally treating the film (FIG. 3B), according to embodiments of the present disclosure.

Figure 3A:
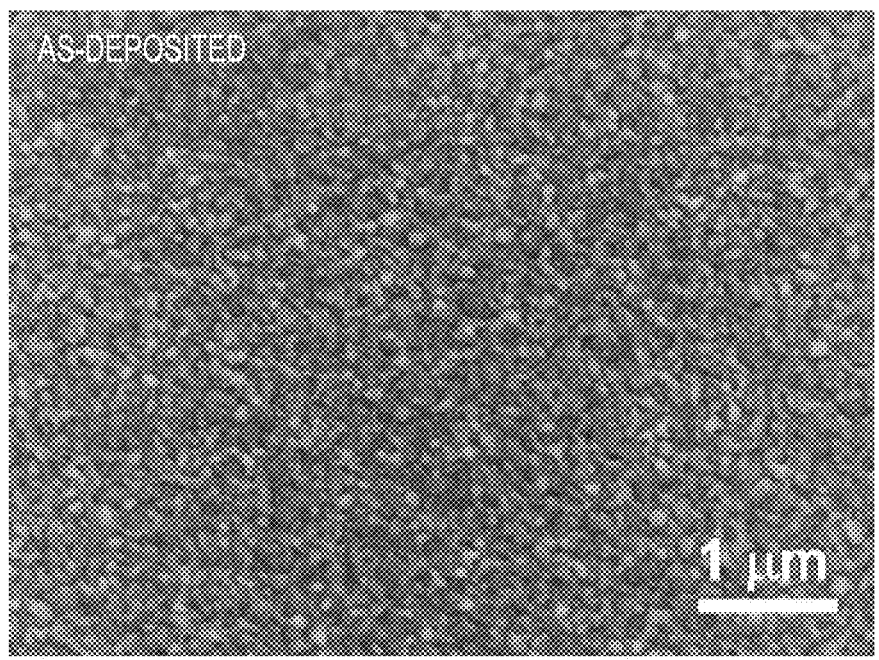
FIGS. 3A and 3B illustrate scanning electron microscopy (SEM) micrographs of an intermediate organo-metal halide perovskite film after the applying and removing steps (FIG.
Figure 3B:
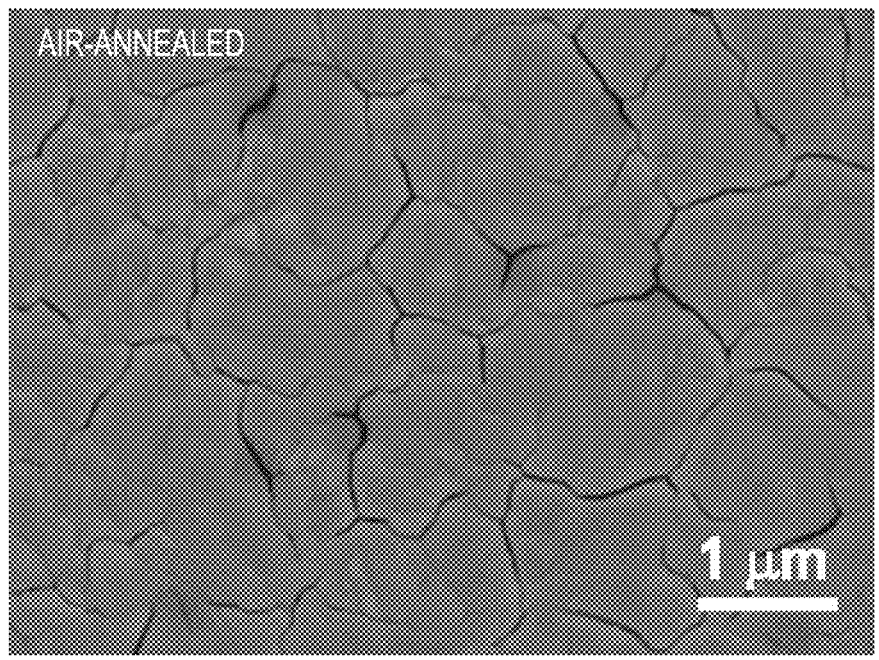
Figure 3C:
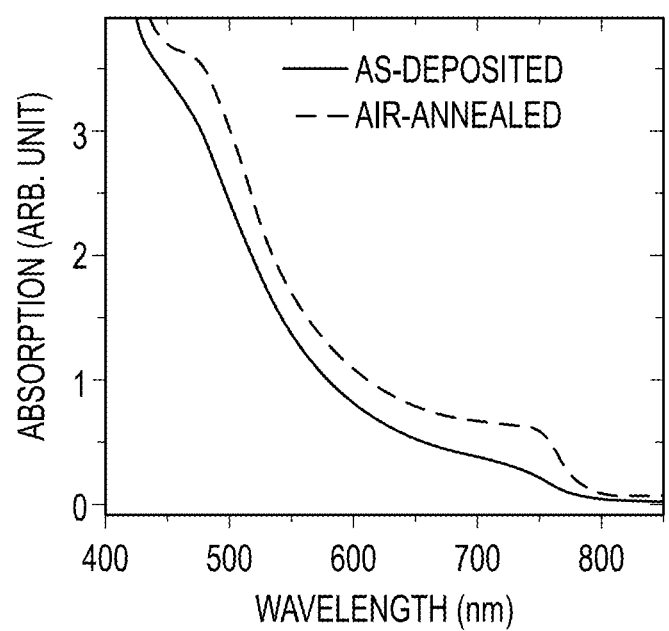

FIG. 3C illustrates absorption spectra of intermediate and final perovskite films, according to embodiments of the present disclosure.

Figure 3D:
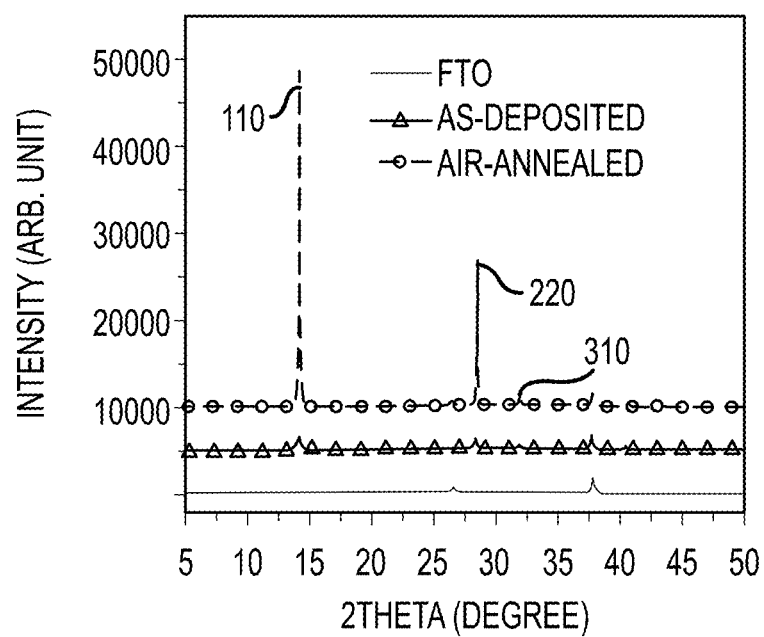

FIG. 3D illustrates X-ray diffraction (XRD) patterns of intermediate and final perovskite films, according to embodiments of the present disclosure.

Figure 3E:
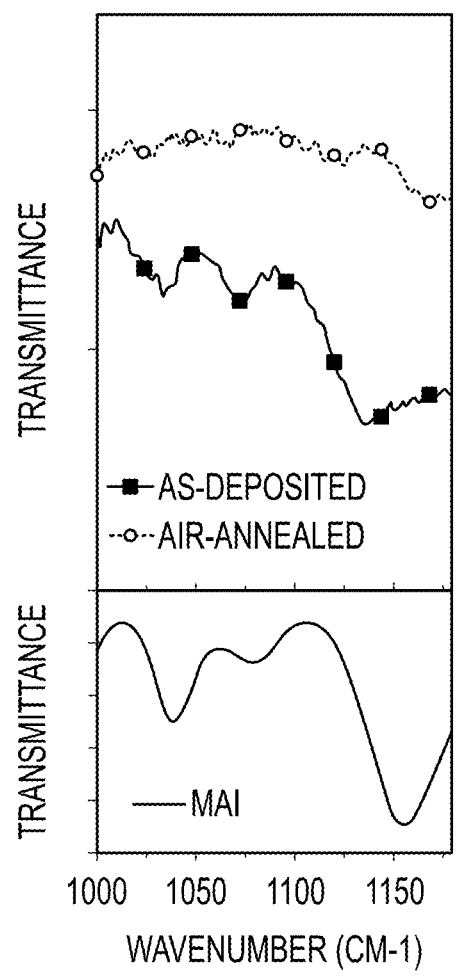

FIG. 3E illustrates Fourier transform infrared (FTIR) spectra of an intermediate perovskite film, a final perovskite film, and a pure MAI film, according to embodiments of the present invention.

Figure 4A:
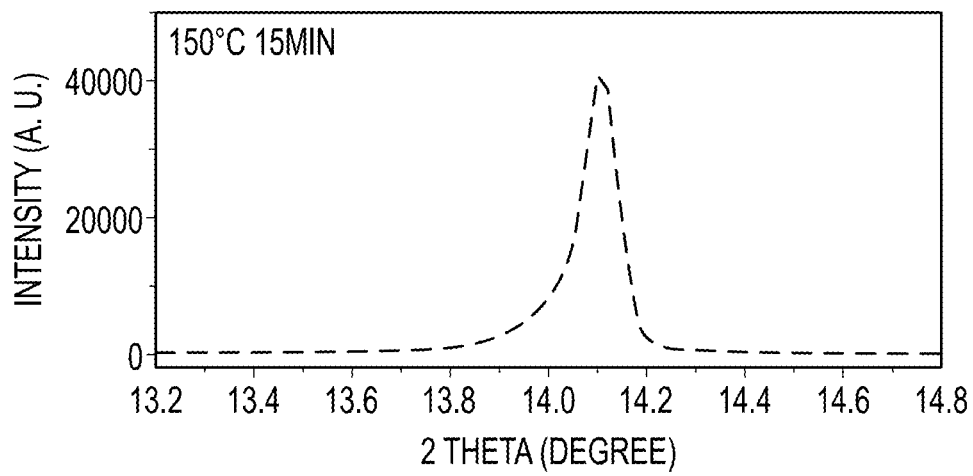

FIG. 4A illustrates an XRD spectrum of the (110) peak for an intermediate organo-metal halide perovskite film, according to embodiments of the present disclosure.

Figure 4B:
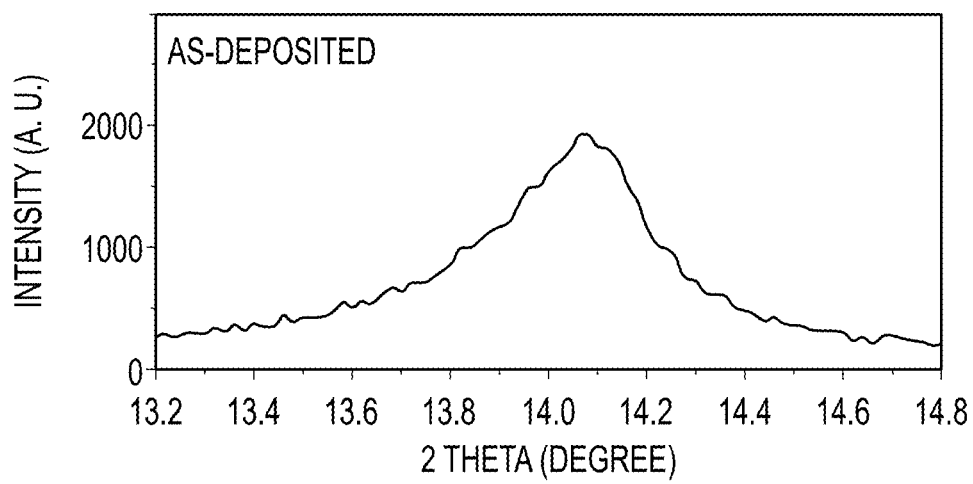

FIG. 4B illustrates an XRD spectrum of the (110) peak for a final organo-metal halide perovskite film, according to embodiment of the present invention.

Figure 5A:
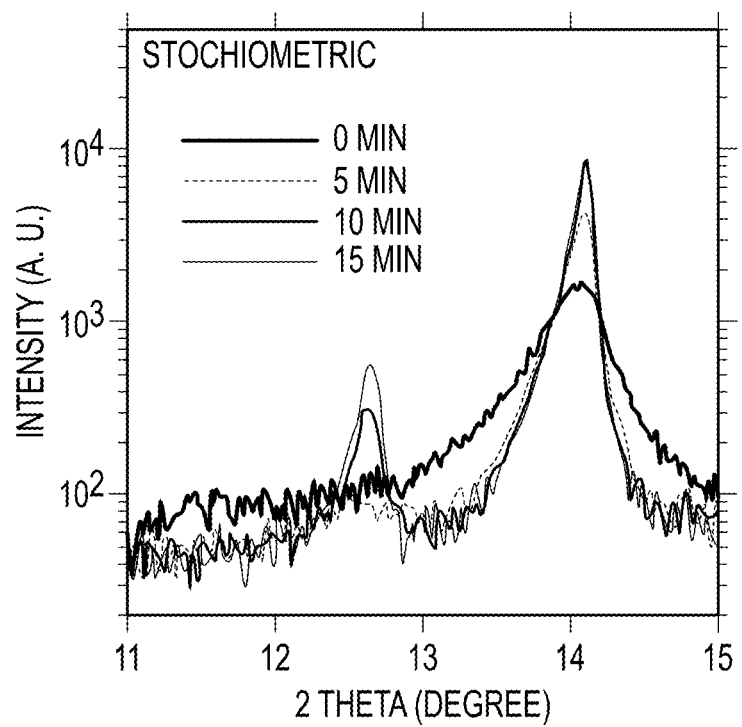
Figure 5B:
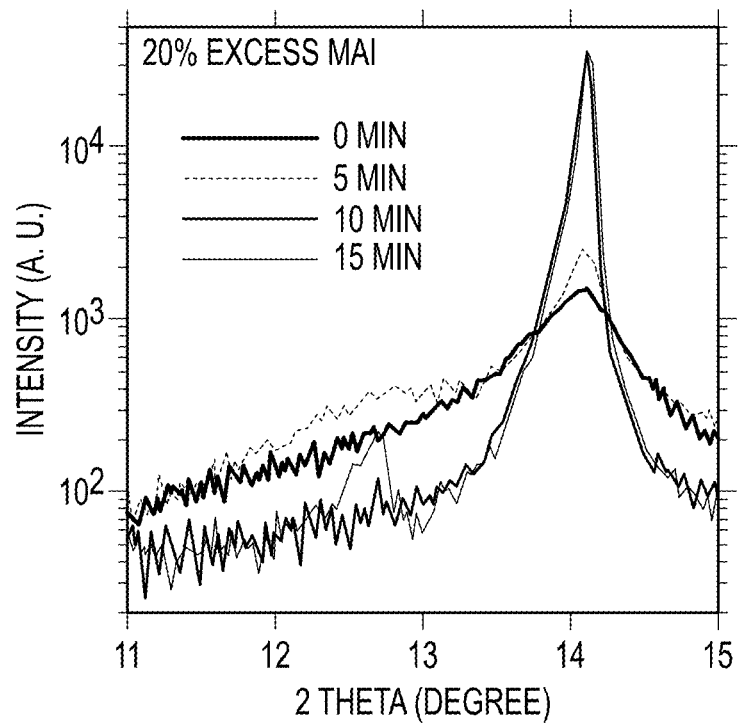

FIGS. 5A and 5B illustrate XRD comparisons of final organo-metal halide perovskite films made with stoichiometric amounts of MAI (FIG. 5A) and excess MAI (FIG. 5B) at different thermally treatment times, according to embodiments of the present disclosure.

Figure 6:
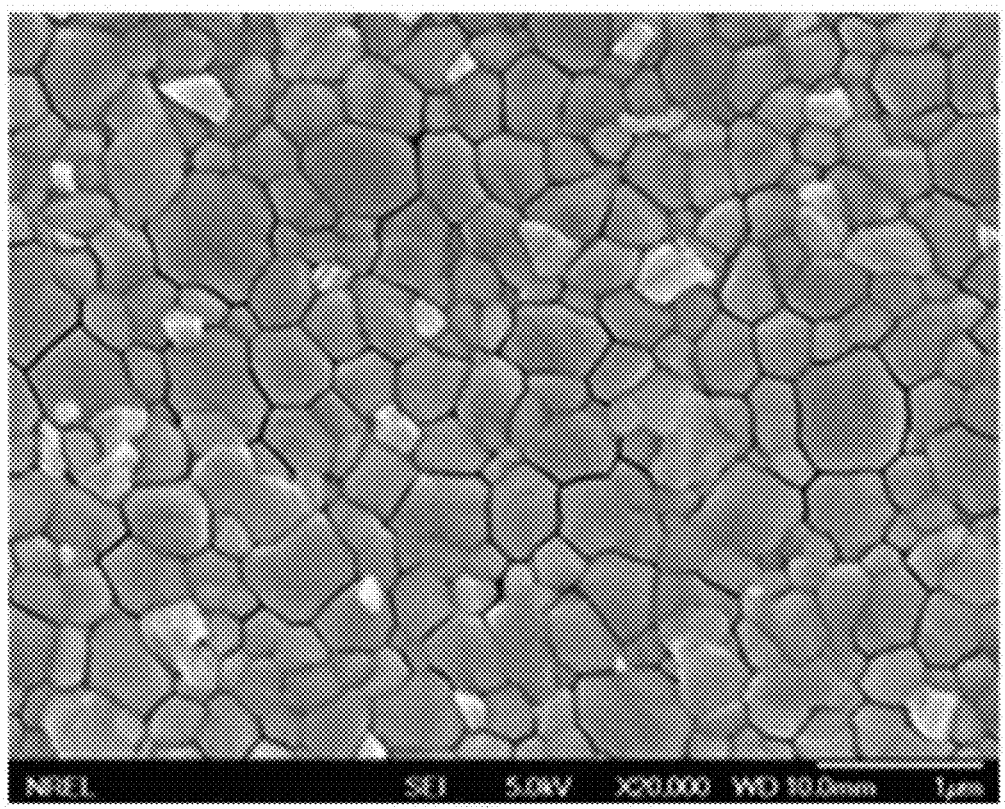
Figure 7A:
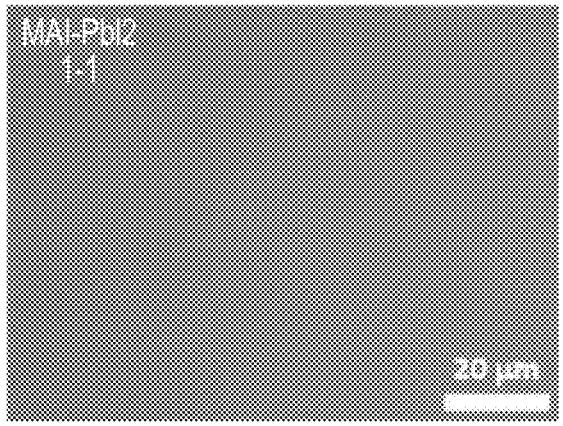
Figure 7B:
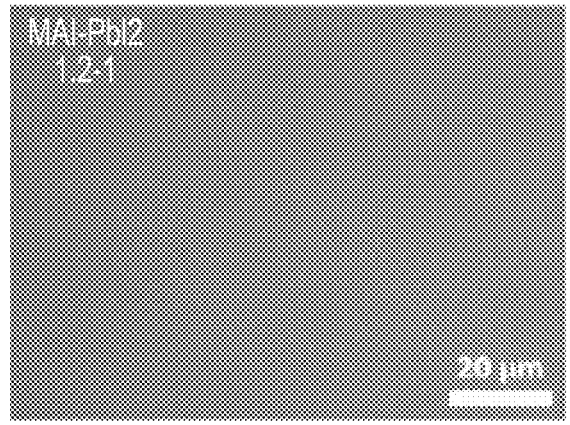
Figure 7C:
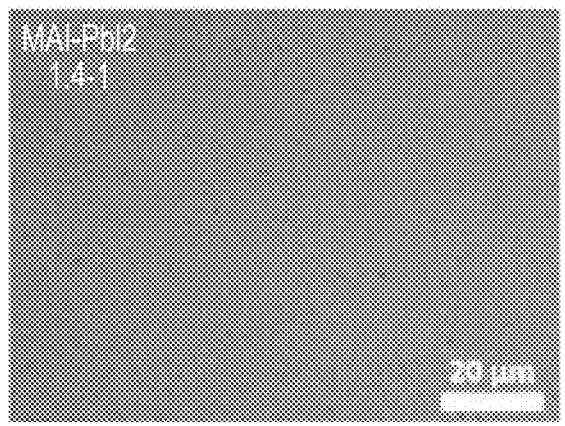
Figure 7D:
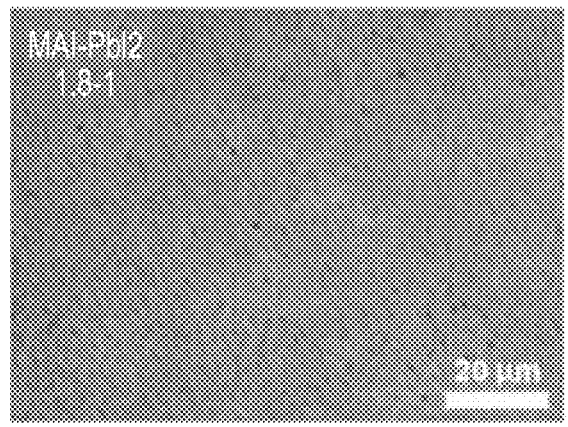

FIG. 6 illustrates an SEM image of a thermally treated final organo-metal halide perovskite film produced using stoichiometric amounts of MAI.

FIGS. 7A, 7B, 7C, and 7D illustrate optical images of thermally treated final organo-metal halide perovskite films prepared with different MAI/PbI$_2$ ratios as indicated, according to embodiments of the present disclosure.

Figure 8A:
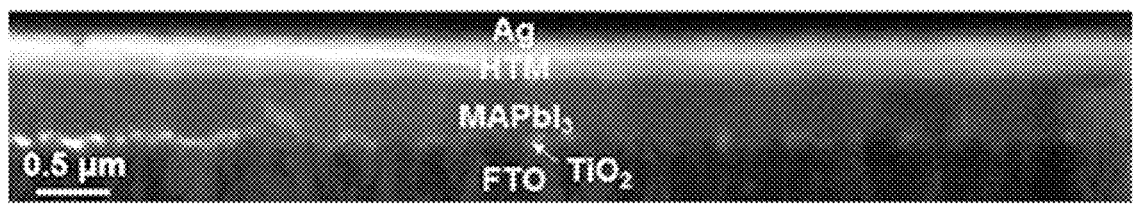
Figure 8B:
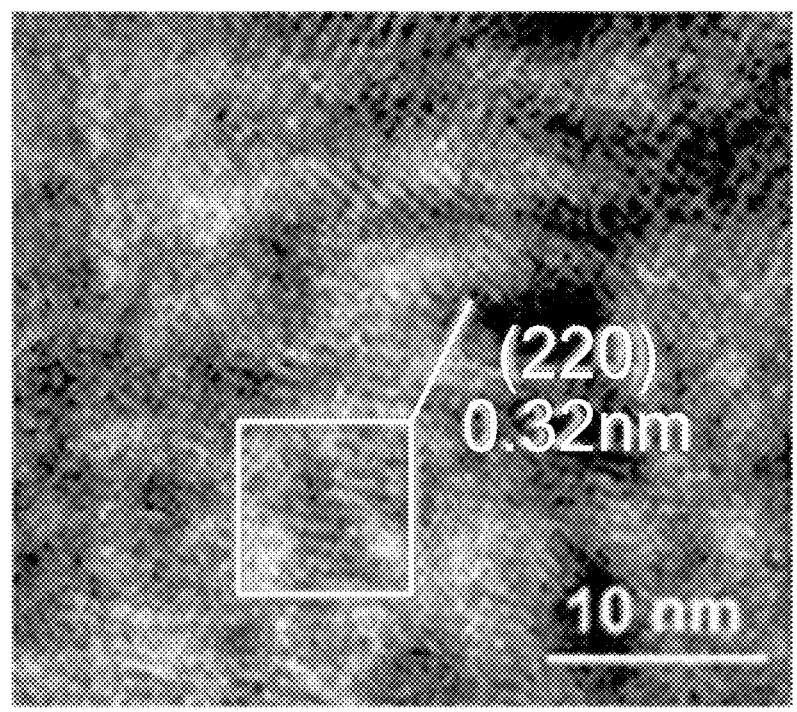
Figure 8C:
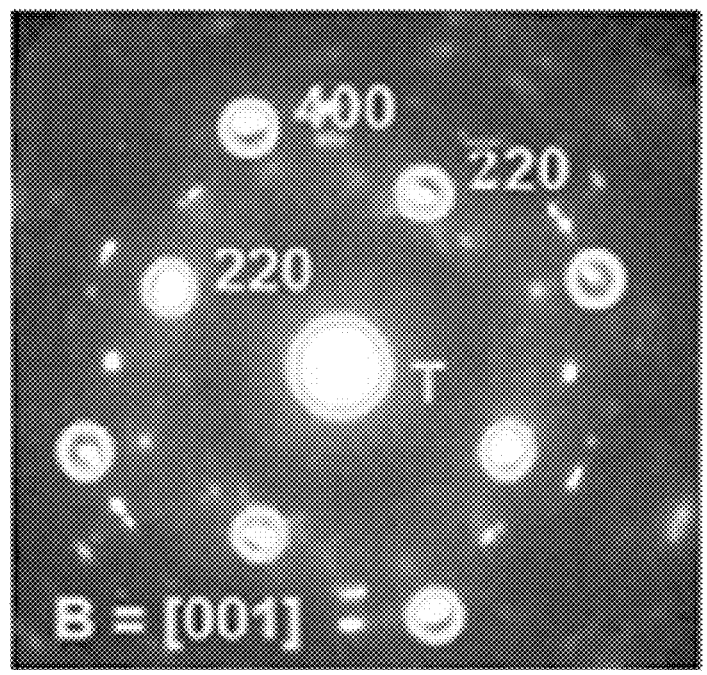
Figure 8D:
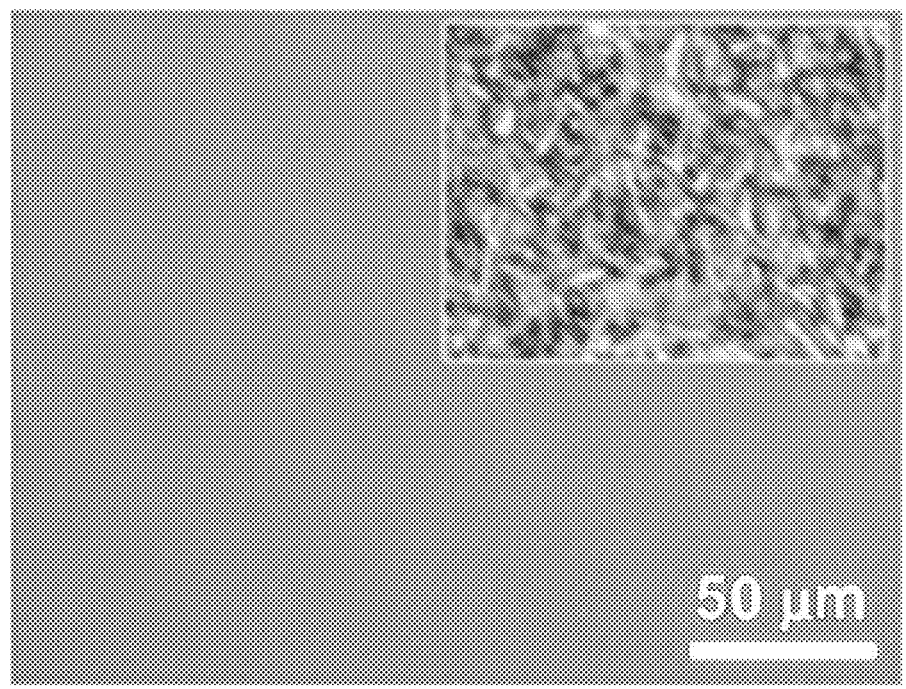
Figure 8E:
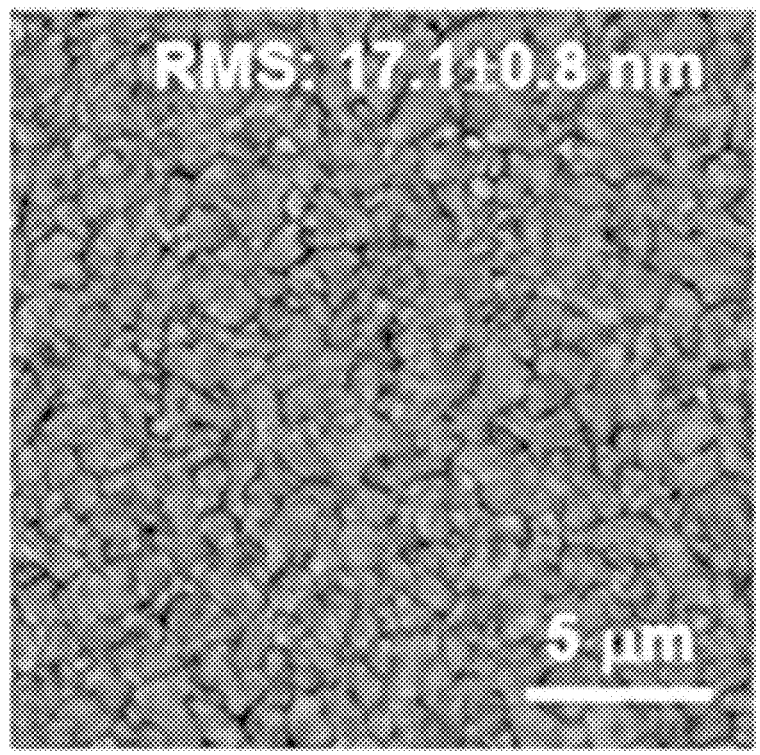
Figure 8F:
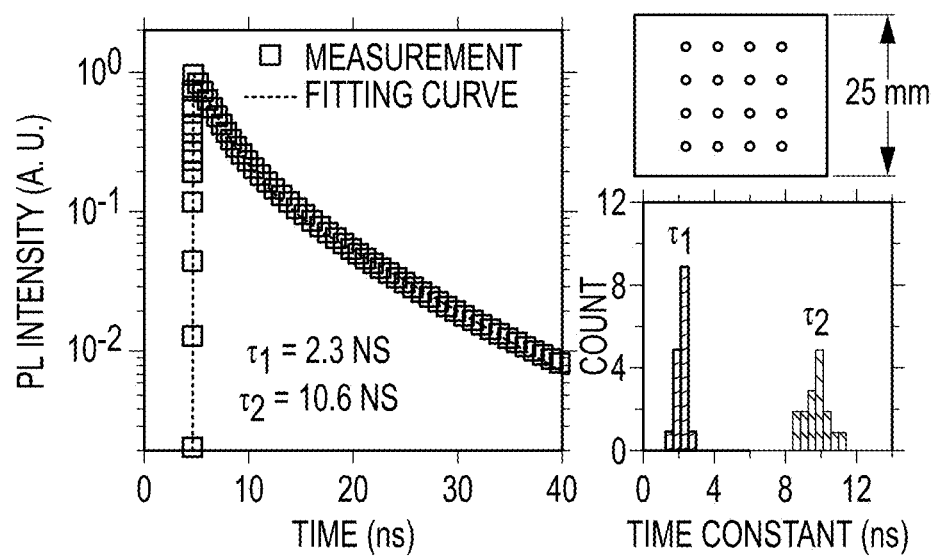

FIGS. 8A through 8F illustrate various physical properties and metrics of final organo-metal halide perovskite films made by embodiments of the present disclosure: FIG. 8A illustrates a cross-section view of perovskite solar cells using a final organo-metal halide perovskite film, green spot is the selected area diffraction (SAD) area; FIG. 8B illustrates the high-resolution transmission electron microscopy (HRTEM) image of a final organo-metal halide perovskite film; FIG. 8C illustrates the SAD pattern of a final organo-metal halide perovskite film; FIG. 8D illustrates an optical image of a final organo-metal halide perovskite film, inset shows perovskite film made by a convention route; FIG. 8E illustrates an AFM image of a final organo-metal halide perovskite film; and FIG. 8F illustrates a typical time-resolved photoluminescence (TRPL) curve of a final organo-metal halide perovskite film, measurement schematics, and their life-time histogram; all according to embodiments of the present disclosure.

Figure 9A:
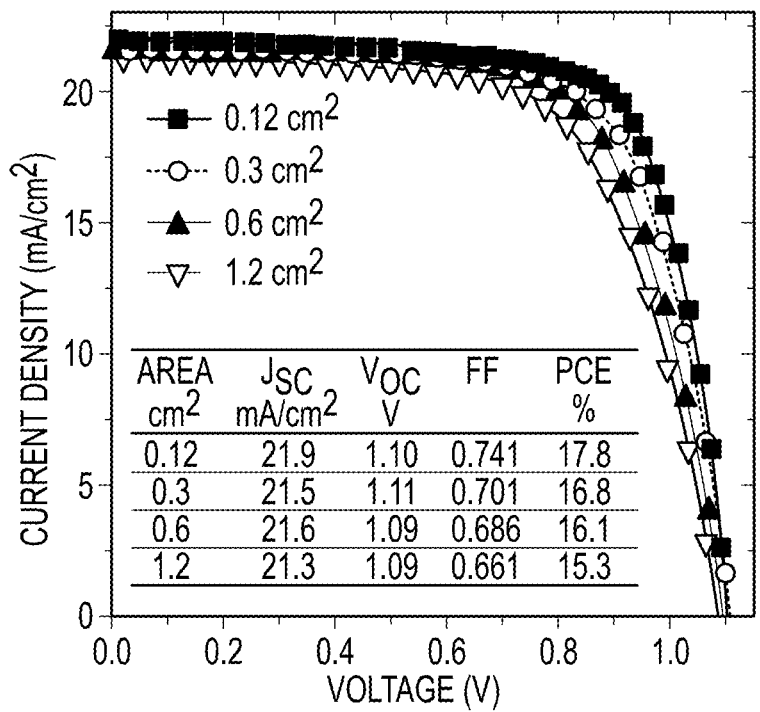
Figure 9B:
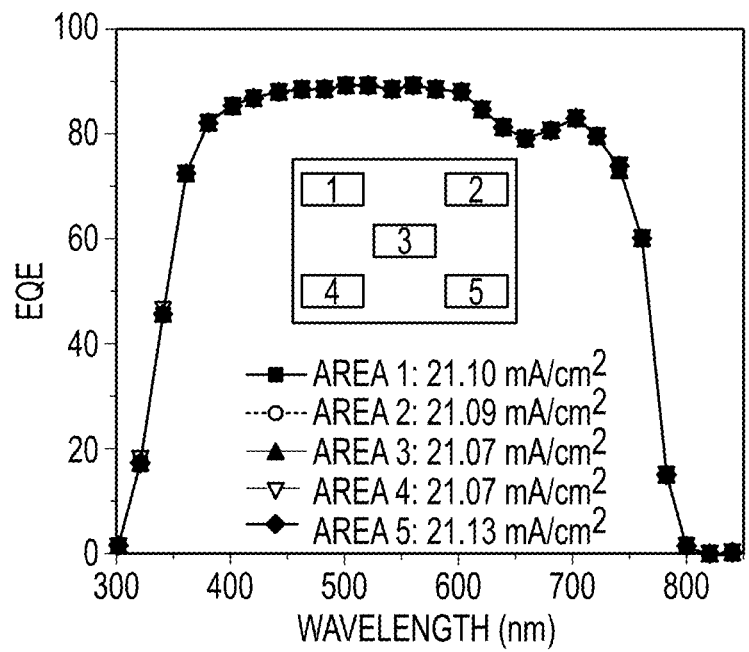
Figure 9C:
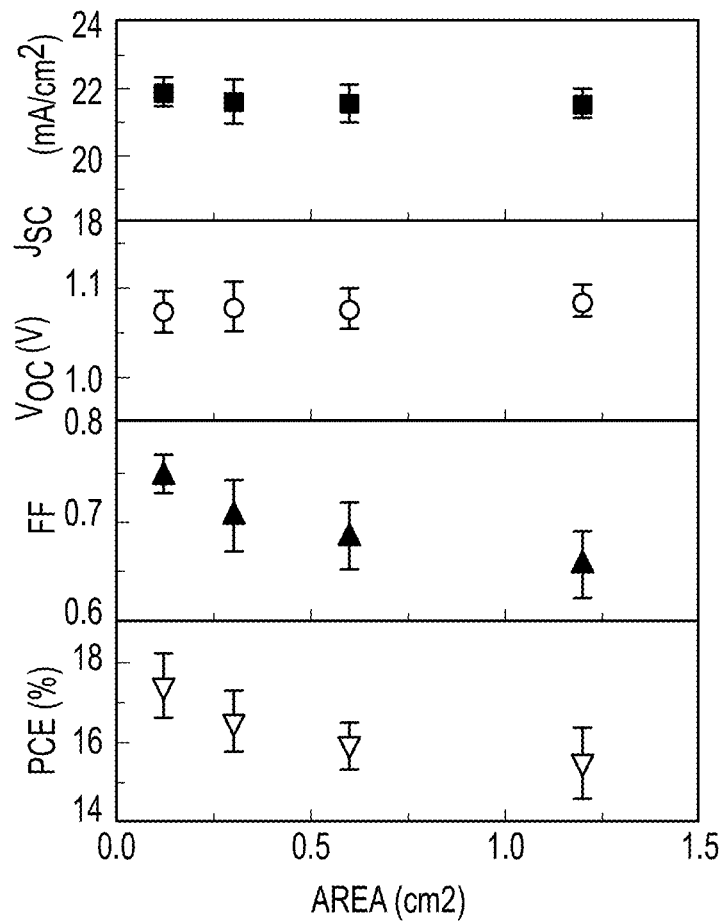
Figure 9D:
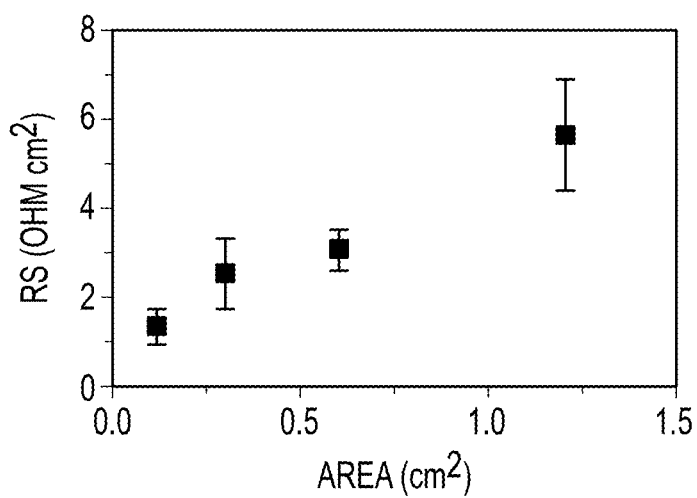

FIGS. 9a through 9d illustrates various metrics for devices produced using final organo-metal halide perovskite films as described herein: FIG. 9A illustrates J-V curves for devices with different areas (0.12 cm$^2$, 0.3 cm$^2$, 0.6 cm$^2$, 1.2 cm$^2$); FIG. 9B illustrates external quantum efficiency (EQE) curves from five different spots in a large area solar cells; FIG. 9C illustrates statistics of PV parameters; and FIG. 9D illustrates the average and standard deviation of $R_s$ with respect to different areas; all according to embodiments of the present disclosure.

Figure 10:
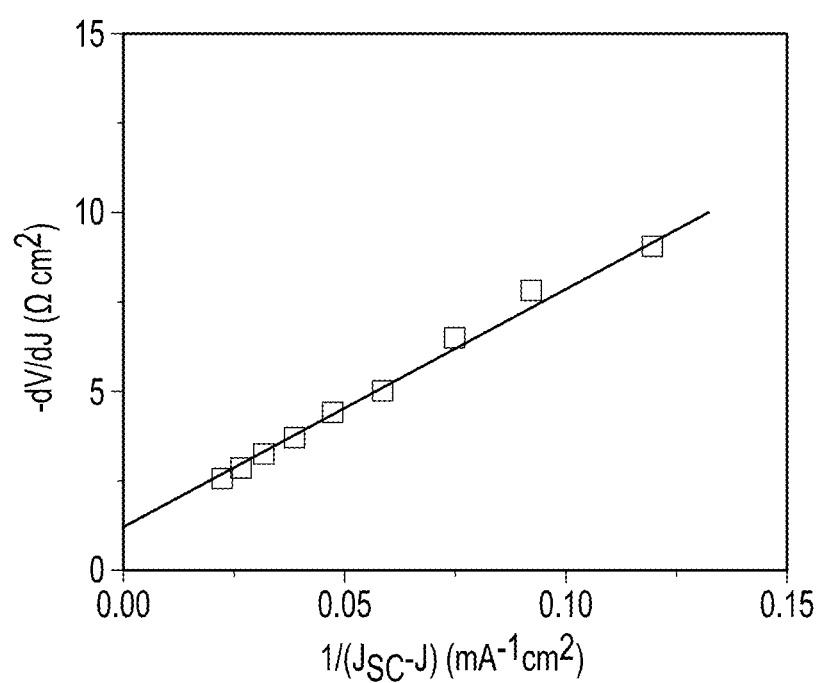

FIG. 10 illustrates a typical fitting of series resistance of a perovskite solar cell device (0.12 cm$^2$), according to embodiments of the present disclosure.

Figure 11A:
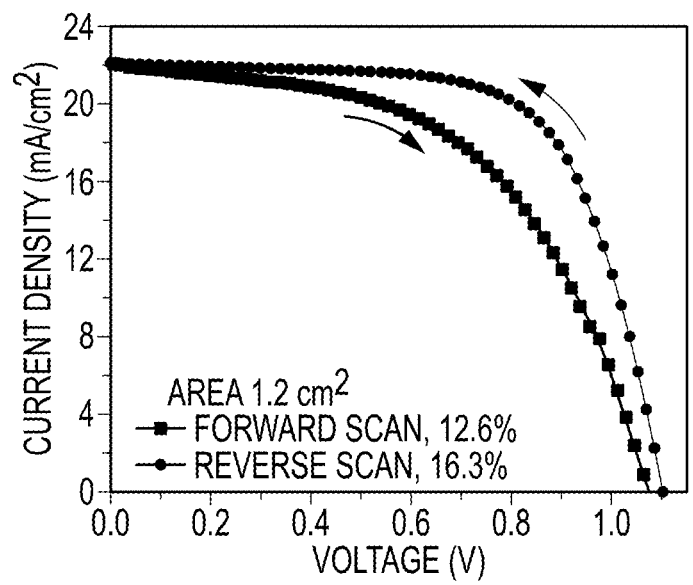
Figure 11B:
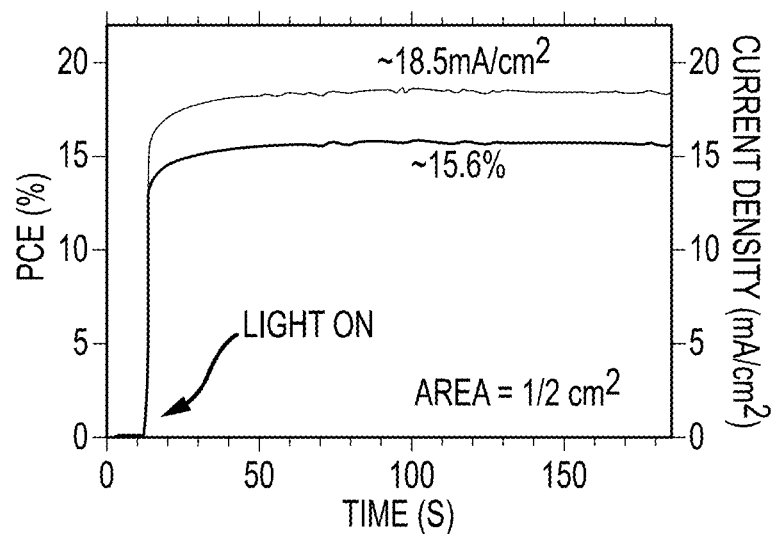

FIG. 11A illustrates a forward scan and reverse can of a cell with 1.2 cm$^2$ active area, and FIG. 11B illustrates stabilized power output as a function of time for this large area device, both according to embodiments of the present disclosure.

Figure 12A:
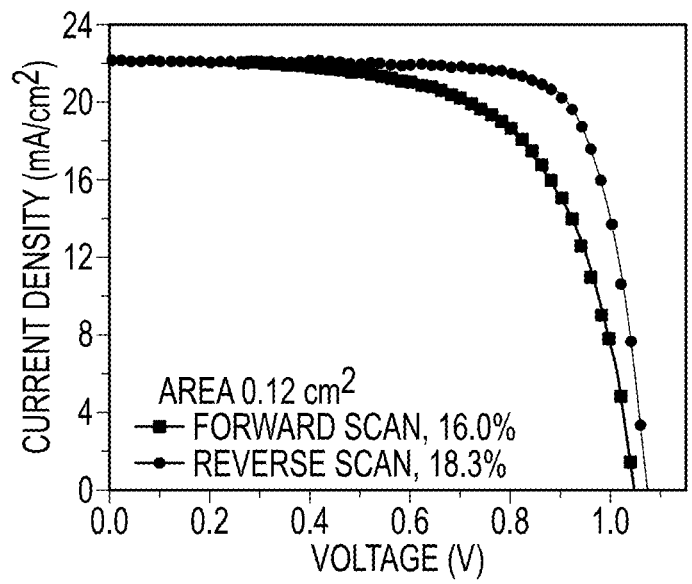
Figure 12B:
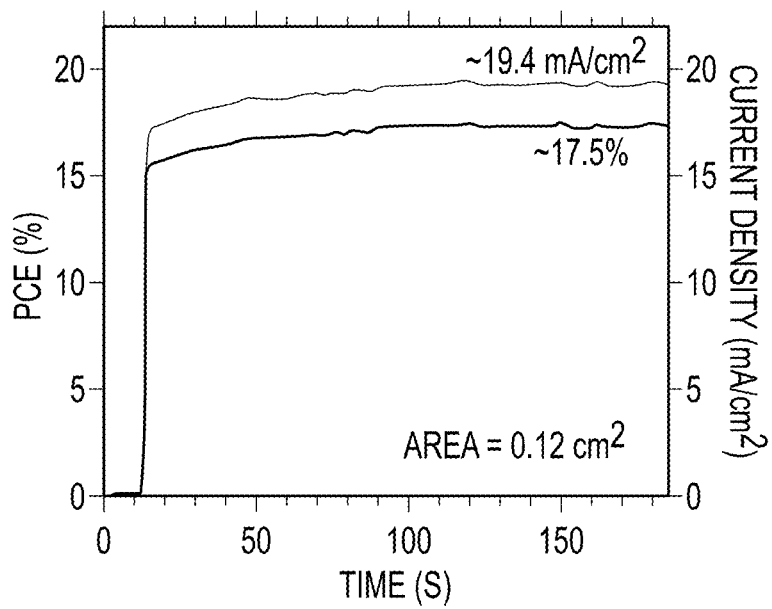

FIG. 12A illustrate the J-V curve of a device with 0.12 cm$^2$ and FIG. 12B illustrates its stabilized power output, both according to embodiments of the present disclosure.

Figure 2:
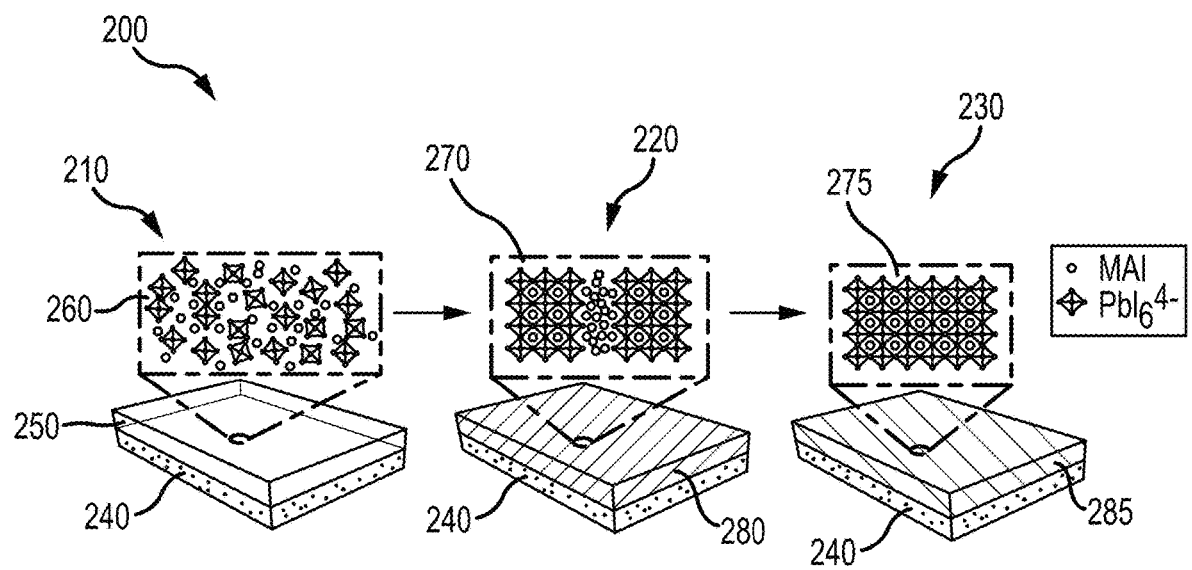
FIG. 2 illustrates schematics of a perovskite film crystallization and crystal growth mechanism, according to embodiments of the present disclosure.
Figure 13A:
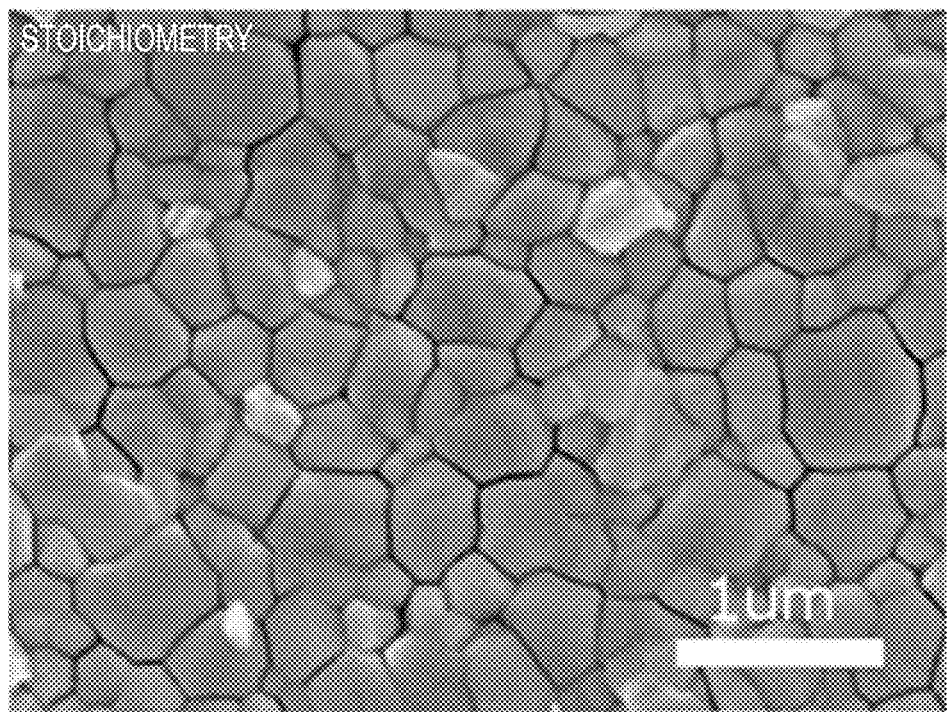
Figure 13B:
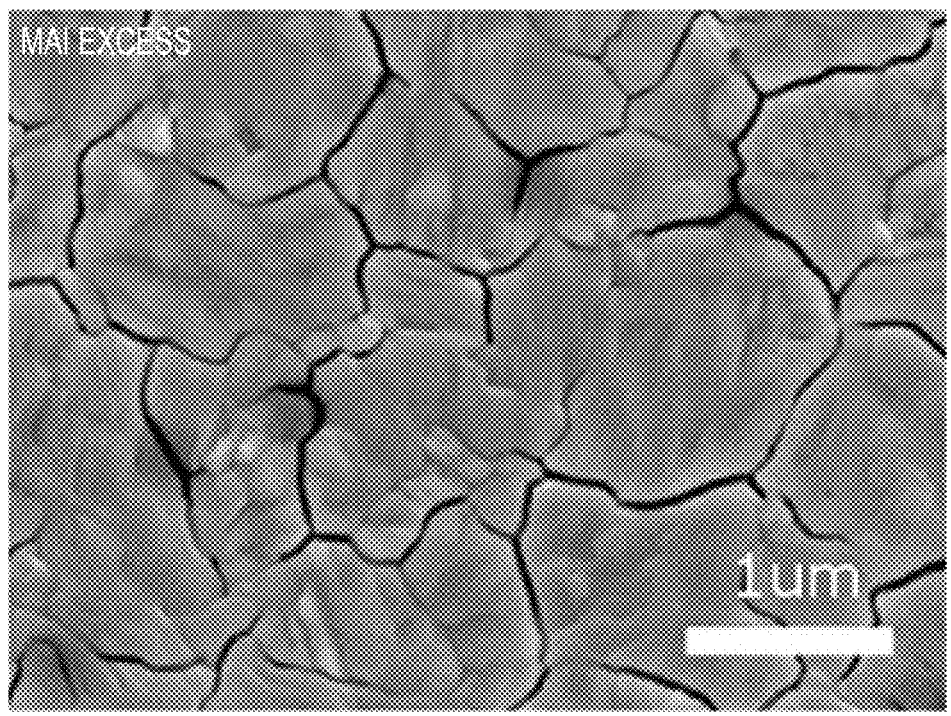
Figure 13C:
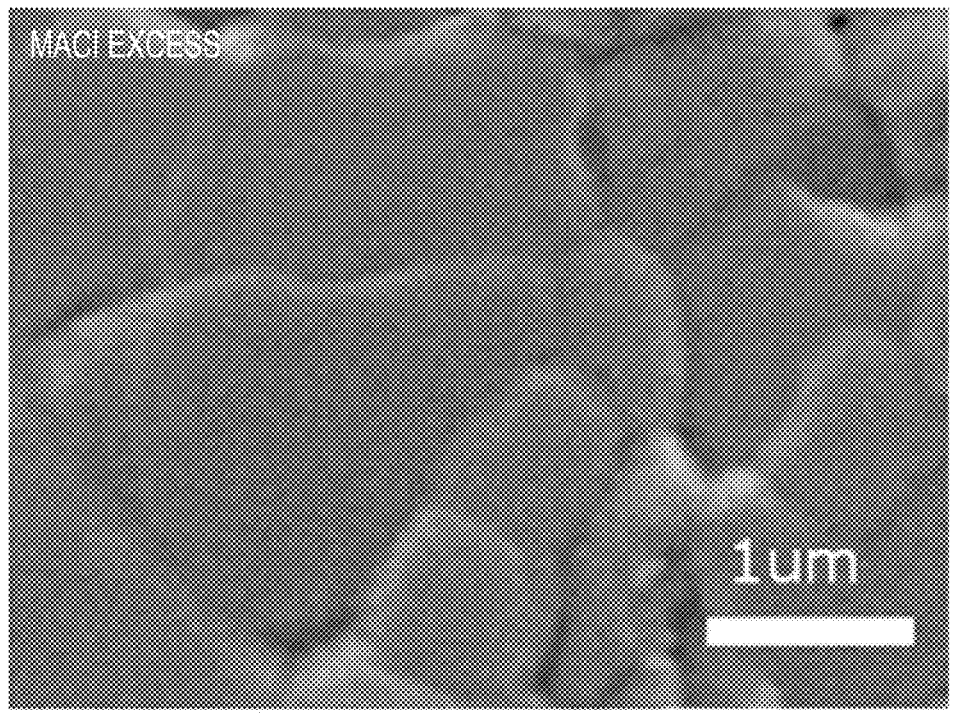
Figure 13D:
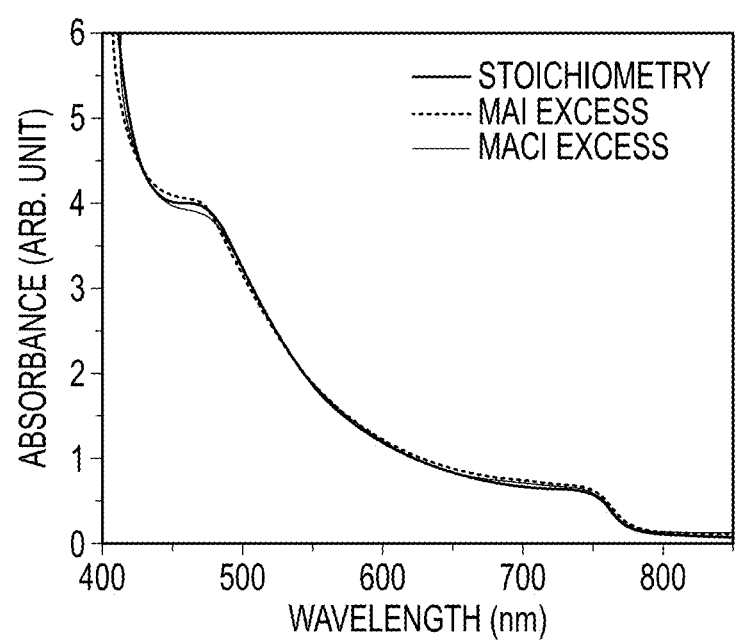
Figure 13E:
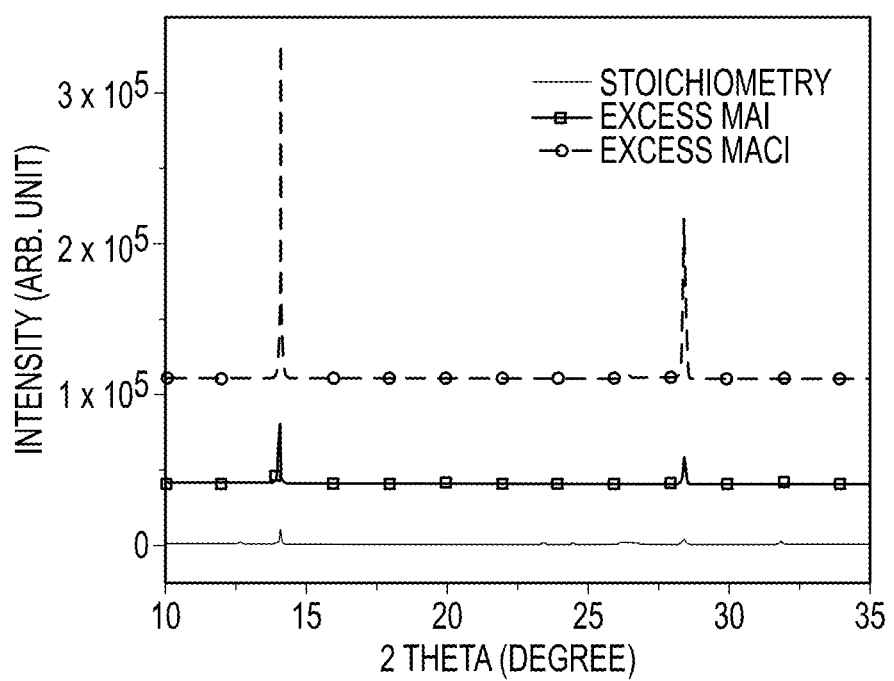

FIG. 13A through C illustrate SEM images of final organo-metal halide perovskite films produced using methods similar to those illustrated in FIG. 2: FIG. 13A using stoichiometric amounts of MAI relative to PbI$_2$ without MACl; FIG. 13B using excess MAI relative to PbI$_2$ without MACl; and FIG. 13C using stoichiometric amounts of MAI relative to PbI$_2$ with some additional MACl ("excess MACl"); FIG. 13D compares the UV/Vis absorption spectra of these three films; and FIG. 13E compares the XRD patterns of these three films, all according to embodiments of the present disclosure.

Figure 14:
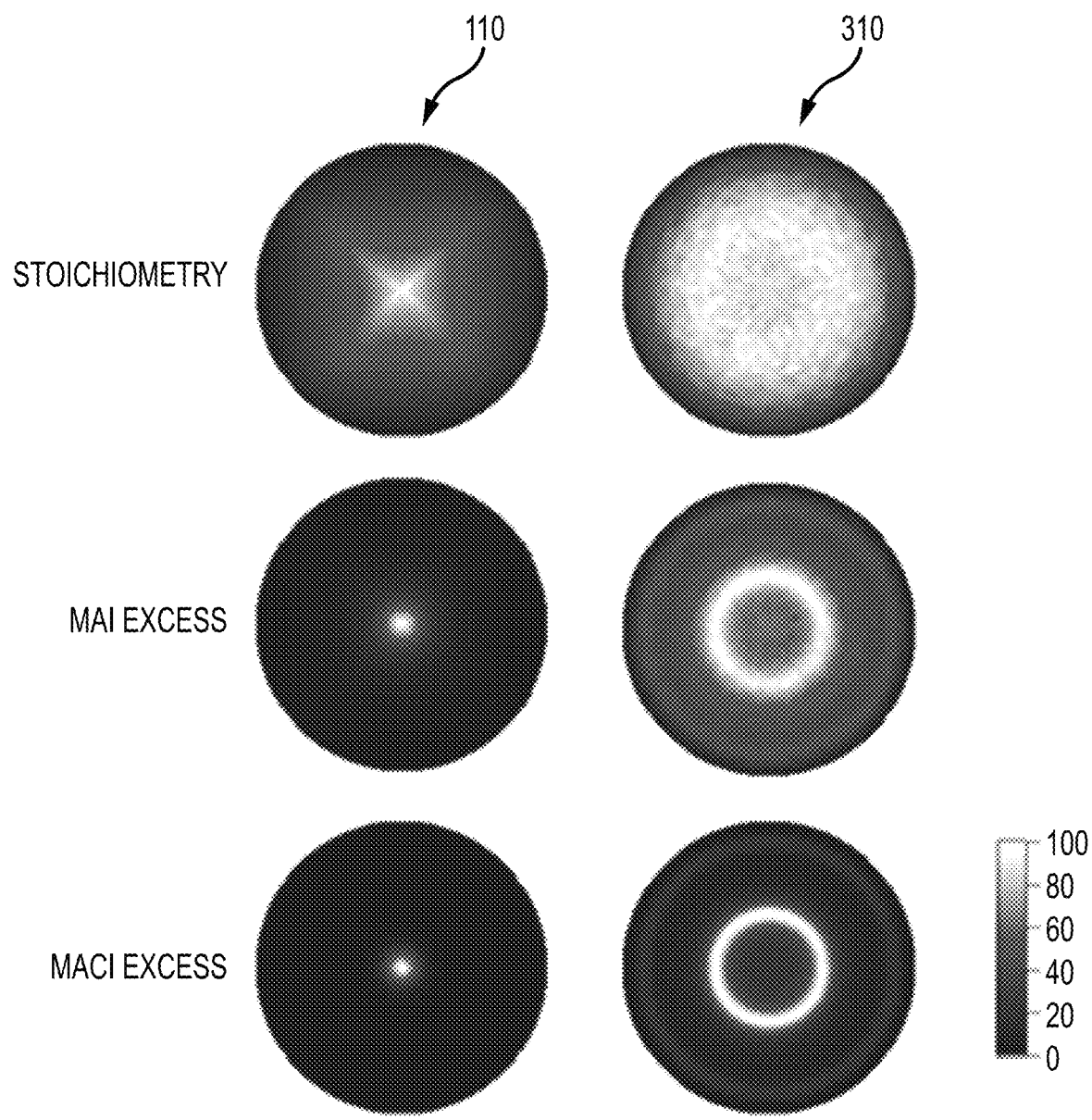

FIG. 14 compares pole figures (110) and (310) for final organo-metal halide perovskite films prepared with stoichiometric MAI only, excess MAI, and excess MACl precursors, according to embodiments of the present disclosure.

Figure 15A:
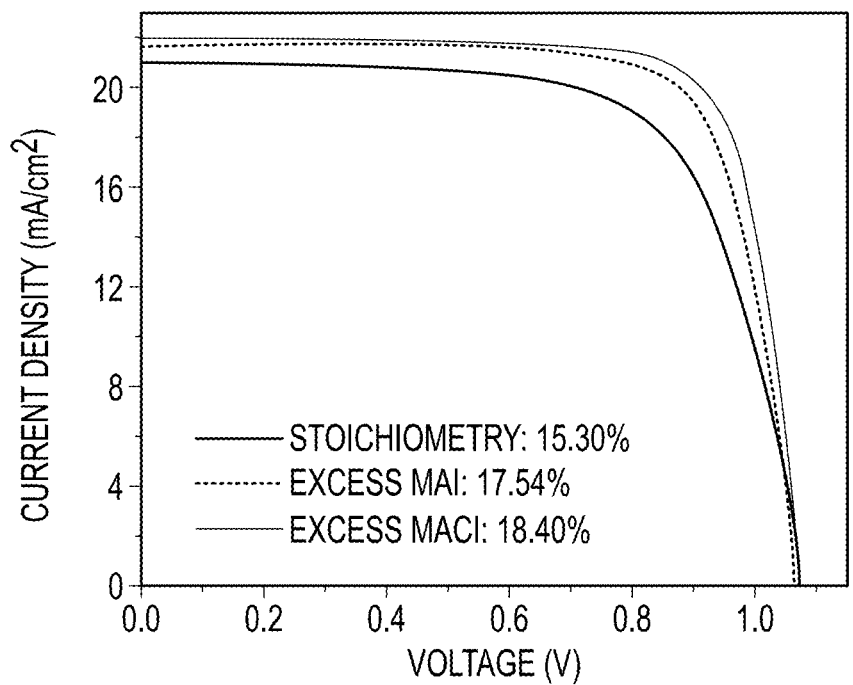
Figure 15B:
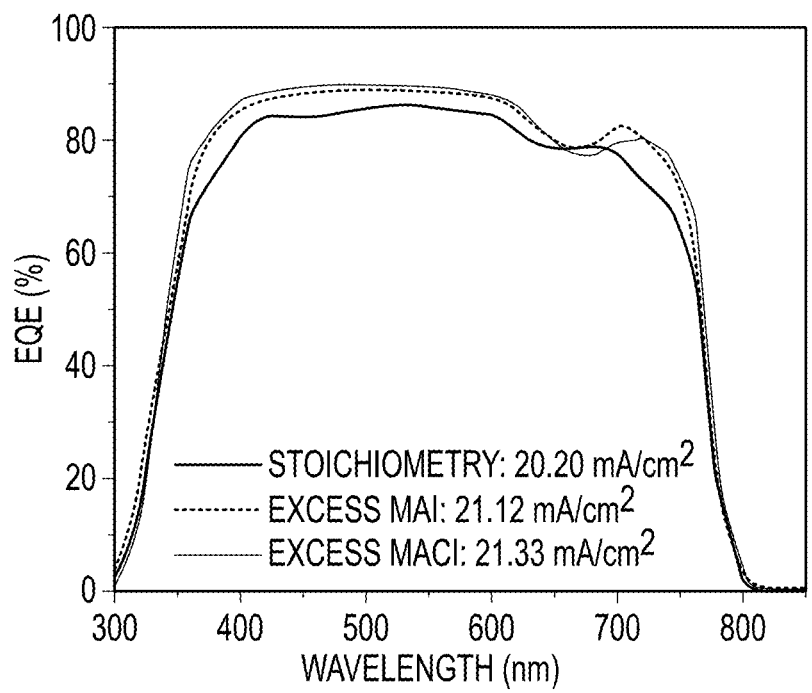

FIGS. 15A and 15B illustrate metrics for devices made by each of the three methods described herein: FIG. 15A J-V curves; and FIG. 15B EQE spectra, both according to embodiments of the present disclosure.

Figure 16A:
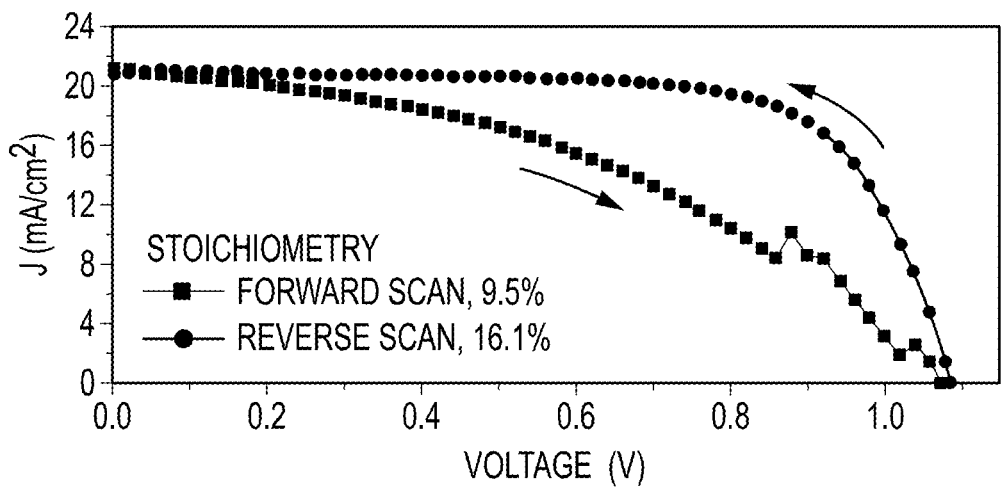
Figure 16B:
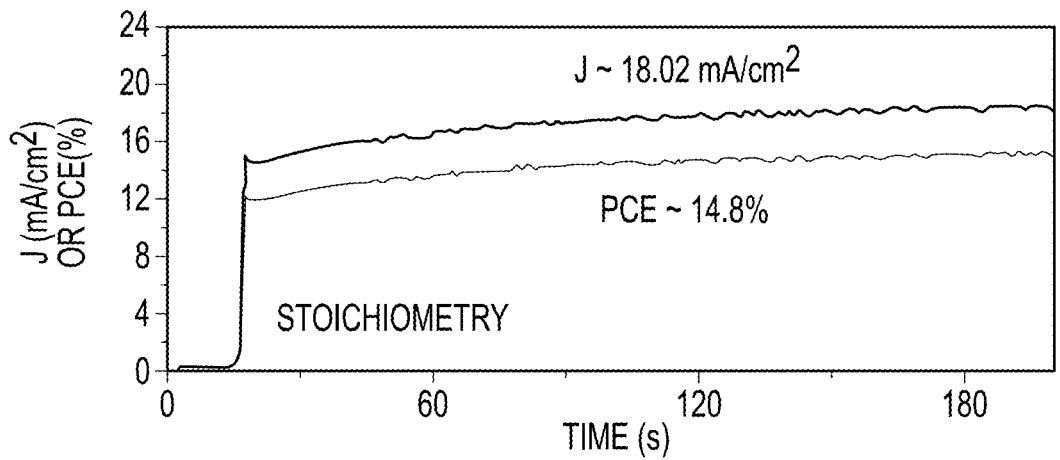
Figure 16C:
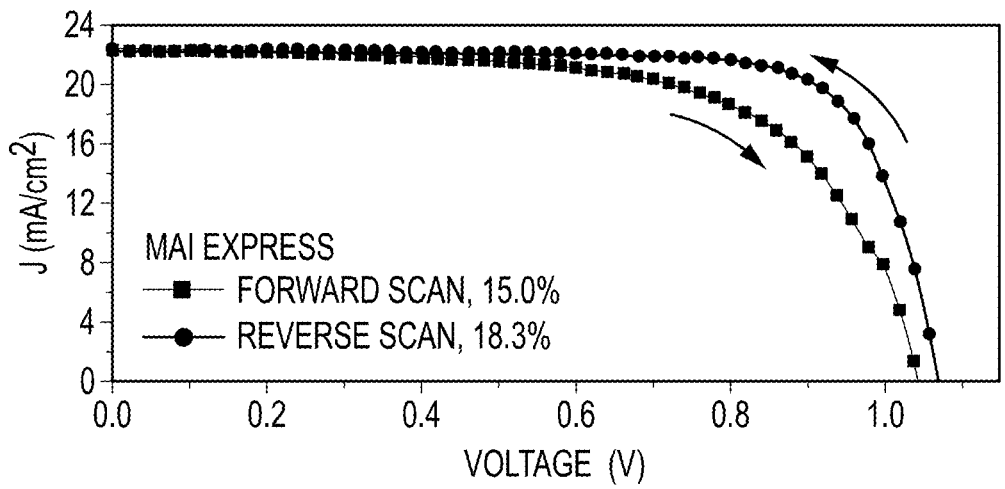
Figure 16D:
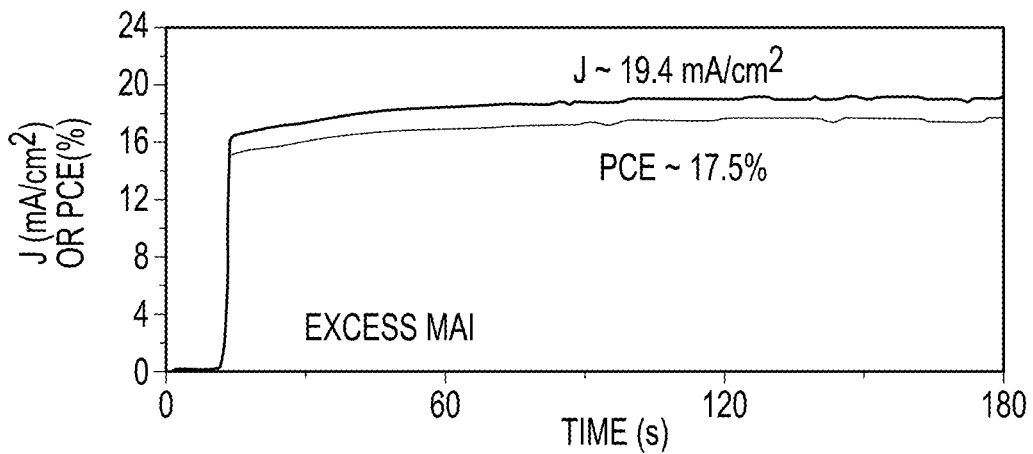
Figure 16E:
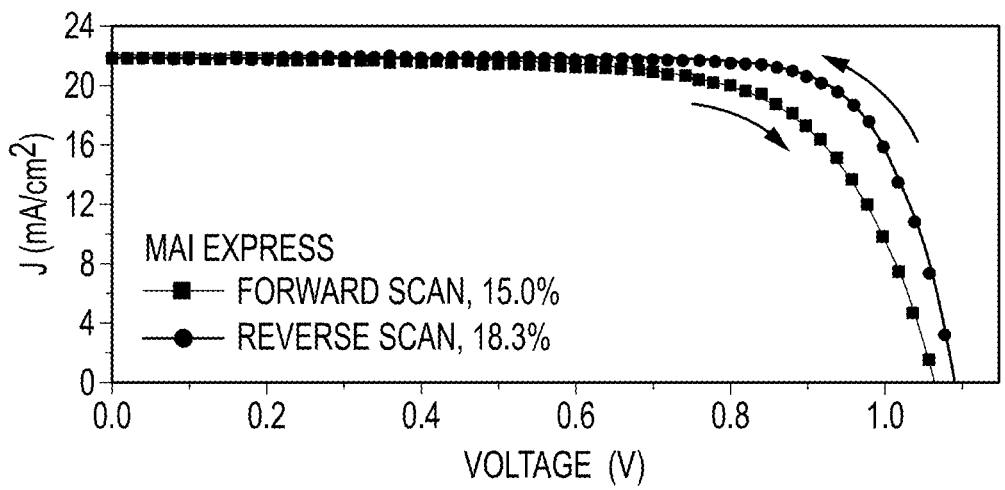
Figure 16F:
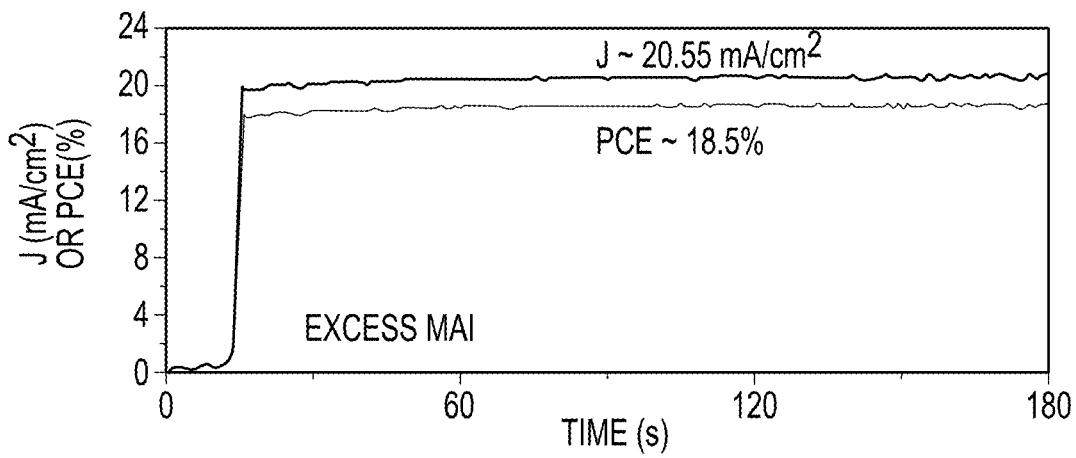

FIGS. 16A through 16F illustrate J-V hysteresis and maximum power output tracking for best performing solar cell devices prepared by the three general methods described herein; FIGS. 16A and 16B for "Stoichiometric" amounts of MAI; FIGS. 16C and 16D for "Excess MAI"; and FIGS. 16E and 16F for "Excess MACl", all according to embodiments of the present disclosure.

Figure 17:
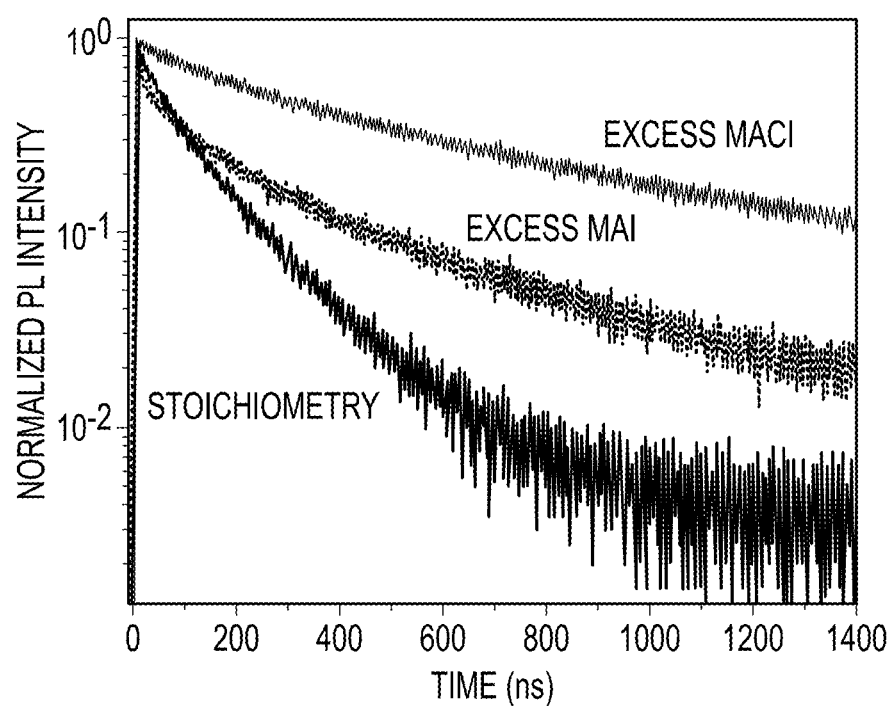

FIG. 17 illustrates the lifetime increases relative to the "Stoichiometric" method, according to embodiments of the present disclosure.

REFERENCE NUMBERS

100 . . . organo-metal halide perovskite
110 . . . cation
120 . . . halide
130 . . . anion
200 . . . method
210 applying
220 . . . removing
230 . . . thermally treating
240 . . . substrate
250 coating
260 . . . solution
270 . . . intermediate organo-metal halide perovskite crystal
275 final organo-metal halide perovskite crystal
280 intermediate organo-metal halide perovskite film
285 final organo-metal halide perovskite film

DETAILED DESCRIPTION

Figure 1:
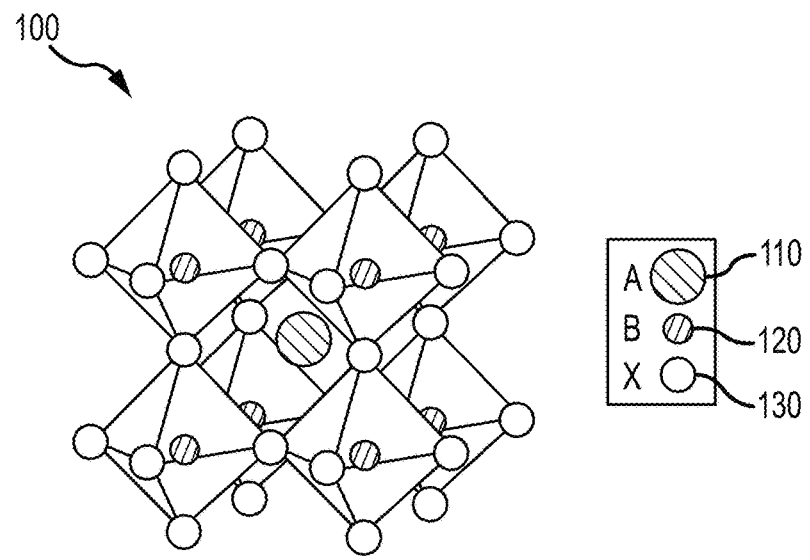
FIG. 1 illustrates a crystalline structure of an organic-inorganic perovskite, according to embodiments of the present disclosure.

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein FIG. 1 illustrates that an organo-metal halide perovskite may organize into cubic crystalline structures, as well as other crystalline structures such as tetragonal and orthorhombic, and may be described by the general formula ABX$_3$, where X (130) is an anion and A (110) and B (120)

are cations, typically of different sizes (A typically larger than B). In a cubic unit cell, the B-cation 120 resides at the eight corners of a cube, while the A-cation 110 is located at the center of the cube with twelve X-anions 130 centrally located between the B-cations 120 along each edge of the unit cell. Typical inorganic perovskites include calcium titanium oxide (calcium titanate) minerals such as, for example, $CaTiO_3$ and $SrTiO_3$. In some embodiments of the present invention, the cation A(110) may include a nitrogen-containing organic compound such as an alkyl ammonium compound. Cation (120) may include a metal and anion B (120) may include a halide.

Additional examples for cation A (110) include organic cations and/or inorganic cations. Organic cations of A (110) may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic cations of A (110) include methylammonium ($CH_3NH^{3+}$), ethylammonium ($CH_3CH_2NH^{3+}$), propylammonium ($CH_3CH_2CH_2NH^{3+}$), butylammonium ($CH_3CH_2CH_2CH_2NH^{3+}$), formamidinium ($NH_2CH=NH^{2+}$), and/or any other suitable nitrogen-containing organic compound. In other examples, a cation A (110) may include an alkylamine. Thus, a cation A (110) may include an organic component with one or more amine groups. For example, cation A (110) may be an alkyl diamine halide such as formamidinium ($CH(NH_2)_2$).

Examples of metal cations 120 include, for example, lead, tin, germanium, and or any other 2+ valence state metal that can charge-balance the organo-metal halide perovskite 100. Examples for the anion X (130) include halides: e.g. fluorine, chlorine, bromine, iodine and/or astatine. In some cases, the organo-metal halide perovskite may include more than one anion X (130), for example pairs of halides; chlorine and iodine, bromine and iodine, and/or any other suitable pairing of halides. In other cases, the organo-metal halide perovskite 100 may include two or more halides of fluorine, chlorine, bromine, iodine, and/or astatine.

Thus, cation A (110), cation B (120), and anion X (130) may be selected within the general formula of $ABX_3$ to produce a wide variety of organo-metal halide perovskite 100, including, for example, methylammonium lead triiodide ($CH_3NH_3PbI_3$), and mixed halogen perovskites such as $CH_3NH_3PbI_{3-x}Cl_x$ and $CH_3NH_3PbI_{3-x}Br_x$. Thus, an organo-metal halide perovskite 100 may have more than one halogen element, where the various halogen elements are present in non-integer quantities; e.g. x is not equal to 1, 2, or 3. In addition, organo-metal halide perovskite, like other perovskites, can form three-dimensional (3-D), two-dimensional (2-D), one-dimensional (1-D) or zero-dimensional (0-D) networks, possessing the same unit structure.

As stated above, the anion A (110) may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

The present disclosure relates to solution methods for producing organo-metal halide perovskite films. Some embodiments may separate crystallization from crystal growth, resulting in the fabrication of highly uniform, large crystal, high crystallinity perovskite films. (Note that as used herein the term "grain coarsening" is synonymous with "crystal growth".) An embodiment of a method for producing an organo-metal halide perovskite film begins with a reaction, which results in the formation of a crystalline organo-metal halide perovskite film. To produce a crystalline organo-metal halide perovskite film of $CH_3NH_3PbI_3$, crystallization begins with the reaction

In some embodiments, a one-to-one ratio of $CH_3NH_3I$ (methylammonium iodide, MAI) to lead iodide ($PbI_2$) may be used to form a crystalline $CH_3NH_3PbI_3$ ($MAPbI_3$) perovskite film. This ratio is referred to herein as a stoichiometric ratio ($MAI:PbI_2=1:1$ molar ratio). The reaction may be conducted in a first liquid solvent containing the MAI and the $PbI_2$. The reaction may include a second solvent to remove the first solvent from the $MAPbI_3$ film. Such a solvent extraction, when used with a stoichiometric ratio of MAI to $PbI_2$, may remove substantially all of the first solvent, eliminating the need to complete a subsequent solvent removal step, for example by heating the film/solvent. In some embodiments of the present disclosure the reaction may be performed with excess MAI where the molar ratio of MAI to $PbI_2$ is greater than one (e.g. $MAI:PbI_2$ is between about 1.01:1.0 and about 2.0:1.0 molar ratio, or $MAI:PbI_2$ is between about 1.01:1.0 and about 1.2:1.0 molar ratio). A reaction step that utilizes a solvent-solvent extraction approach may lead to rapid crystallization of perovskite film (e.g. $MAPbI_3$) uniformly over the entire surface of a substrate, leading to the formation of a compact (e.g. densely packed crystals without pinholes), uniform organo-metal halide perovskite film.

A second step of a method for producing an organo-metal halide perovskite film includes a thermally treating the organo-metal halide perovskite film (e.g. heating), which increases the size of the perovskite crystals initially formed by the preceding reaction step. This heating step may also remove any residual solvent remaining in the film. Thermally treating the organo-metal halide perovskite film may be performed in an air environment (referred to herein as "air-annealing") or in an inert environment (e.g. $N_2$, Ar, etc.). As shown herein, completing the first reaction step with excess MAI (e.g. where $MAI:PbI_2$ is between about 1.01:1.0 and about 1.2:1.0 molar ratio) may result in final organo-metal halide perovskite films with significantly improved physical properties and/or performance metrics, in particular increased crystal size and alignment. Without wishing to be bound by theory, a dynamic "MAI loss-compensation" mechanism, during the air annealing, is proposed to explain the observed crystal size growth and resulting film quality improvements.

FIG. 2 summarizes an embodiment of a method 200 for producing a final organo-metal halide perovskite film 285. The method 200 includes applying 210 a solution 260 to a surface of a substrate 240, where the solution 260 contains at least one halogen-containing precursor such as MAI, formamidinium iodide (FAI), and/or cesium iodide (CsI) and a metal halide such as lead iodide ($PbI_2$), tin iodide ($SnI_2$), and/or bismuth iodide ($BiI_3$), indium iodide ($InI_3$). In some embodiments, the solution 260 may include a first halogen-containing precursor (e.g. MAI), a second halogen-containing precursor (e.g. methylammonium chloride; MACl), and a metal halide (e.g. $PbI_2$). In some embodiments, the halogen-containing precursor may be present at a ratio of halogen-containing precursor to metal halide that is greater than 1.0. In some embodiments, a first halogen-containing precursor (e.g. MAI), a second halogen-containing precursor (e.g. MACl), and a metal halide (e.g. PbI$_2$) may be present at a molar ratio of MAI:MACl:PbI$_2$ between about 1.0:0.01:1.0 an about 1.0:0.7:1.0. The halogen-containing precursor and the metal halide may be present as a mixture with a first solvent to form the solution 260. In some embodiments of the present disclosure, the first solvent may include at least one of a high boiling point (e.g. greater than 150° C.) aprotic solvent, such as 1-methyl-2-pyrrolidinone (NMP), γ-butyrolactone (GBL), and/or dimethyl sulfoxide (DMSO). The applying 210 may be accomplished by spin-coating the solution 260 onto the substrate 240. In some embodiments, the applying 210 may be accomplished by any suitable solution-processing technique; e.g. spin-coating, dip-coating, curtain-coating, blade-coating, slot-die-coating, spray-coating, and/or inkjet-printing. In some embodiments, the solution 260 may be applied to a substrate 240 such as glass, a transparent conducting oxide, plastic, metal, and/or any other substrate suitable for producing a functioning solar utilizing an organo-metal halide perovskite film as an absorbing layer. In some embodiments, the applying 210 may be performed at a temperature from about 0° C. to about 50° C. In some embodiments, the applying 210 may be performed at a temperature from about 0° C. to about 35° C. The applying 210 results in a coating 250 of the solution 260 on the surface of the substrate 240. In general, lower temperatures are preferred for the applying 210 to prevent and/or minimize crystal growth of perovskite film during this step. In addition, lower temperatures minimize evaporative losses of the first solvent and accidental drying of the surface of the substrate 240 during the applying 210, so that the subsequent removing 220 of the first solvent by solvent-solvent extraction may be performed.

After the applying 210 of the solution 260 (containing a first solvent, at least one halogen-containing precursor and a metal halide) to the substrate 240, the method 200 may proceed with removing 220 the first solvent from the coating 250, for example by solvent-solvent extraction. In some embodiments of the present disclosure the removing 220 of the first solvent may be performed by immersing the substrate 240 and the coating 250 in a second solvent such as diethyl ether. In some embodiments, the second solvent may include other nonpolar solvents such as toluene, chlorobenzene, and/or hexane. In general, an amount of the second solvent should be provided to completely remove the first solvent from the coating 250 (e.g. enough volume that the second solvent's solubility limit for the first solvent is not exceeded). In general, the removing 220 may be performed at a temperature that does not exceed the boiling point of the second solvent. Thus, in some embodiments, the removing 220 may be performed at a temperature that is between about 0° C. and about 150° C. In some embodiments, the removing 220 may be performed at a temperature that is between about 0° C. and about 35° C. In some embodiments, the removing 220 of the first solvent by contacting the first solvent with the second solvent may be performed over a period of time that is between about 30 seconds and about 30 minutes. In some embodiments, the removing 220 of the first solvent by contacting the first solvent with the second solvent may be performed over a period of time that is between about 2 minutes and about 5 minutes. The removing 220 of the first solvent from the coating 250 on the substrate 240 may result in the formation of an intermediate organo-metal halide perovskite crystal 270 to create an intermediate organo-metal halide perovskite film 280 on the substrate 240.

In some embodiments, an intermediate organo-metal halide perovskite crystal 270 may have an average crystal size that is less than 200 nm. In some embodiments of the present disclosure, an intermediate organo-metal halide perovskite crystal 270 may have an average crystal size between about 30 nm and about 150 nm. In some embodiments, an intermediate organo-metal halide perovskite film 280 may have a thickness between about 300 nm and 500 nm. In general, the second solvent should be highly miscible with the first solvent (e.g. have a high solubility for the first solvent) and have a low or no solubility for the perovskite films. Thus, the second solvent may normally completely, or nearly completely, remove all of the first solvent from the intermediate film simply by providing a sufficient quantity of the second solvent that its solubility limit for the first solvent is not exceeded. As a result of the solvent-solvent extraction, the removing 220 induces nucleation of the intermediate organo-metal halide perovskite crystals 270 having relatively small crystal sizes (relative to the final crystals). Then, in the subsequent thermally treating 230 of the intermediate organo-metal halide perovskite crystals 270, the elevated temperatures induce crystal growth of the intermediate organo-metal halide perovskite crystals 270, resulting in the final organo-metal halide perovskite crystals 275 that make up the final organo-metal halide perovskite halide film 285. Ideally, the second solvent has a low boiling temperature and can easily evaporate in ambient condition. The annealing in the second step will help further removal of the residual solvent.

After the removing 220 of the first solvent, the method 200 may continue with thermally treating 230 the intermediate organo-metal halide perovskite film 280. Thermally treating 230 removes the second solvent and any remaining first solvent from the intermediate organo-metal halide perovskite film 280, and results in the formation of a final organo-metal halide perovskite film 285 positioned on the substrate 240. Thermally treating 230 the intermediate organo-metal halide perovskite film 280 results in growth of the intermediate crystals 270 present in the intermediate organo-metal halide perovskite film 280, resulting in the formation of final organo-metal halide perovskite crystals 275 that are larger than the intermediate organo-metal halide perovskite crystals 270. In some embodiments of the present disclosure, thermally treating 230 the intermediate organo-metal halide perovskite film 280 may be performed at a temperature between about 100° C. and about 200° C., for a time period between about a few seconds and 3 hours. In some embodiments, thermally treating 230 the intermediate organo-metal halide perovskite film 280 may be performed for a time period between about a few seconds and about 30 minutes.

Referring again to FIG. 2, in summary, the applying 210 step and removing 220 step, via solvent-solvent extraction, results in the reaction-formation of an intermediate organo-metal halide perovskite film 280, which may have excess MAI within the intermediate organo-metal halide perovskite film 280. The solvent-solvent extraction method for removing 220 the first solvent from the coating 250 applied to the substrate 240 during the applying 210 step may lead to the rapid crystallization of the intermediate organo-metal halide perovskite film 280 uniformly over the entire substrate 240. This may result in the formation relatively small, densely packed intermediate organo-metal halide perovskite crystals 270 on the substrate 240. Subsequent thermal annealing 230 induces growth of the intermediate organo-metal halide perovskite crystals 270 to produce the final organo-metal halide perovskite film 285 of having relatively large final organo-metal halide perovskite crystals 275.

FIGS. 3A and 3B show, respectively, the morphologies of an intermediate organo-metal halide perovskite film before thermally treating the intermediate film and of a final organo-metal halide perovskite film after thermally treating the intermediate film. As illustrated in FIG. 3A, the presence of excess MAI results in the formation of an intermediate organo-metal halide perovskite film having fine crystals with relatively non-uniform average crystal sizes between about 30 nm and about 150 nm. This non-uniform crystal size appears to be related to the excess of MAI present in the intermediate organo-metal halide perovskite film potentially reducing contact of neighboring intermediate organo-metal halide perovskite crystals, therefore retarding the crystal growth (for example, by Ostwald ripening) during the removing step by solvent-solvent extraction. After thermally treating the intermediate film, the larger final organo-metal halide perovskite crystals form in the final organo-metal halide perovskite film with in-plane characteristic average crystal sizes between about 1 micrometer and about 2 micrometers (where in-plane refers to the lateral X-Y plane; not based on a cross sectional view in the Z direction). While the film thickness corresponding to the final organo-metal halide perovskite film was about 350 nm, the in-planar average crystal sizes (e.g. lengths) of the final organo-metal halide perovskite crystals were at least 3 to 6 times that of the average crystal sizes in the normal direction of the film, which indicates the perovskite crystal growth in the final organo-metal halide perovskite film does not strictly follow a general polycrystalline growth mode. UV/Vis absorption spectra of the intermediate organo-metal halide perovskite film (labeled "MAPbI$_3$ as-deposited") and the final organo-metal halide perovskite film (labeled "MAPbI$_3$ 150° C./15 min") are shown in FIG. 3C with absorption edges close to 800 nm. Both spectra in FIG. 3C show very low base lines at long wavelengths, which is a characteristic of smooth films. Absorption is much stronger especially at the absorption edge for the final organo-metal halide perovskite film.

FIG. 3D presents the XRD patterns of an intermediate organo-metal halide perovskite film and a final organo-metal halide perovskite film, as produced per embodiments of the present invention. While the diffraction patterns of both films may be assigned to the tetragonal phase (space group 14/mcm), more 110-textured (i.e., more crystal orientation aligned along the [110] direction) film characteristics are shown in the air-annealed (e.g. thermal annealing in air) perovskite thin film. Quantitatively, the ratio of the intensity of (110) to (310) peak increases from about 3.1 to about 22.9. Further, as seen in FIG. 3D and FIGS. 4A and 4B, the intensity and full width at half maximum (FWHM) of the (110) peak changes enormously (almost 20 folds in intensity, FWHM from 0.42 to 0.08 degree) after thermally treating the intermediate film. This is indicative of a simultaneous enhancement in crystallinity and domain size after air annealing step. The proliferation of crystal defects within the crystals that are observed in room temperature solvent-solvent extraction processed intermediate organo-metal halide perovskite crystals are eliminated, which are also responsible for the intensity increase in addition to texturation (e.g. aligned orientation of crystals). The change of (110) diffraction peak from a nano-characteristic broad peak to a small-FWHM sharp peak is related to the observed crystal coarsening (where coursing is synonymous with crystal growth). These XRD results suggest the formation of a thin final organo-metal halide perovskite film containing fine perovskite crystals after solvent-solvent extraction of the first solvent, and a textured final organo-metal halide perovskite film having larger crystal size after thermally treating the intermediate film, which is in good agreement with the SEM results. The excess MAI does not show any feature in the XRD pattern in the intermediate organo-metal halide perovskite film, which may be due to a low-crystallinity of the MAI in the film. FIG. 3E illustrates FTIR spectra for samples mechanically removed from the intermediate organo-metal halide perovskite film, the final organo-metal halide perovskite film, and from MAI control film. FIG. 3E illustrates that three weak transmittance peaks between 1020 cm$^{-1}$ and 1250 cm$^{-1}$ exists in the intermediate organo-metal halide perovskite film and these three peaks readily disappear in the air-annealed film. These clearly suggest the existence of an MAI phase in the intermediate organo-metal halide perovskite film and the complete consumption of MAI during thermally treating the intermediate film to produce the final organo-metal halide perovskite film.

Without wishing to be bound by theory, the observations and data explained above lead to the following "MAI loss-compensation" mechanism. In this mechanism, for a model system of MAI reacting with PbI$_2$ to produce a final MAPbI$_3$ organo-metal halide perovskite film, the organic component, MAI, in the crystalline structure of MAPbI$_3$ (PbI$_2$.MAI) de-intercalates to form PbI$_2$ preferably at the boundaries of crystals at elevated temperature (e.g. during the thermally treating step), while the as-formed excess MAI phase from the solvent-solvent extraction provides excess MAI, which may counter-balance MAI losses from the film occurring during the thermal treating due to evaporative losses resulting from the elevated temperature. This allows instantaneous diffusion of MAI either in the vapor phase and/or solid state into the thermally-created vacancies in the crystals due to a local composition gradient across the crystal boundaries. The conversion of solid state PbI$_2$ and MAI precursor in the intermediate film to the final film due to thermal treating was confirmed by the presence of an obviously larger portion (relative to films prepared using stoichiometric amounts of halogen-containing precursor) of PbI$_2$ in the intermediate organo-metal halide perovskite film after thermally treating the intermediate film for about 10 minutes to about 15 minutes, as shown in FIGS. 5A and 5B. Via such a dynamic process of "MAI loss-compensation", multiple relatively small and randomly oriented crystals in an intermediate organo-metal halide perovskite film, resulting from the solvent-solvent processing, meet to form one large oriented crystal. This unique crystal growth process may be responsible for the textured growth observed in the final organo-metal halide perovskite films. Interestingly, the perovskite films processed using the new methods described herein have the advantage of combining both full coverage and high-crystallinity characteristics, which highlights the benefits of separating reaction-formation (achieved by the applying and removing steps of FIG. 2) and crystal growth (achieved by thermally treating the intermediate film as shown in FIG. 2), as disclosed in some embodiments of the present invention. To further illustrate the role of excess MAI, a final organo-metal halide perovskite film was produced using the same process as described above, but using stoichiometric amounts of MAI relative to PbI$_2$. As shown in FIG. 6, crystal size increased after thermally treating the intermediate film, however, the final organo-metal halide perovskite crystals were much small than those obtained using excess amounts of MAI during the applying step. Different ratios of MAI/PbI$_2$ were also explored, and it was found by optical imaging that higher excess MAI (>40%) results in a rougher surface (see FIGS. 7A, 7B, 7C, and 7D).

In addition to full coverage, high crystallinity and an advantageous (110) texture, the organo-metal halide perovskite films produced utilizing excess MAI retained large-area (>1 cm$^2$) uniformity at multiple scales over the entire surface areas of the substrates, up to areas as large as 1 inch by 1 inch. For example, FIG. 8A illustrates a cross-sectional transmitting electron microscopy (TEM) image with a final organo-metal halide perovskite film sandwiched between TiO$_2$/FTO and hole-transporting materials (HTM)/Ag layers. The dark-contrast final organo-metal halide perovskite film shows a uniform thickness of ~350 nm. FIG. 8B illustrates a high-resolution TEM (HRTEM) image, which shows clear crystal fringes with an inter-plane distance of about 0.32 nm, which is assigned to the (220) or (004) planes. FIG. 8C illustrates the SAD pattern, which further confirms the tetragonal perovskite structure of the obtained crystal. Note that the brightest diffraction spots are indexed while other weak diffraction spots may be associated with electron-beam damage. The uniformity of the final organo-metal halide perovskite film at relatively larger scale was also examined by optical microscopy. FIG. 8D illustrates an optical image of FIG. 3B, with the notable feature being the absence of visible flaws within the final organo-metal halide perovskite film. For reference, a control perovskite film made using the stoichiometric amount of halogen-containing precursor (MAI), with solvent-solvent extraction, and thermally treating the resultant intermediate film is shown in the inset of FIG. 8D with the same magnification.

To further demonstrate the film's surface uniformity at the centimeter scale, atomic force microscopy (AFM) was used to measure the film roughness of the final organo-metal halide perovskite film at eight different spots, with each spot at least 5 mm apart from each other on the inch-sized film, all of which showed a root-mean-square (RMS) roughness of 17 nm with a one-standard deviation variation of 1 nm. FIG. 8E illustrates a typical AFM image with micrometer-sized crystals. Finally, TRPL was employed to confirm the optoelectronic quality of the uniform final organo-metal halide perovskite film by probing 16 equally distributed points for a 25 by 25 mm samples as shown in FIG. 8F. Photoluminescence (PL) decay curves were fitted using two-component exponential decay model as reported previously. The TRPL data has a very narrow distribution with $\tau_1$=2.04±0.27 ns and $\tau_2$=9.62±0.66 ns, where the variation is one standard deviation, which indicates a high quality final organo-metal halide perovskite film over a large area, which is consistent with the structural characterization.

Device performance versus active area, as a result of the increased crystal sizes present in the final organo-metal halide perovskite films and as a result of the more uniform perovskite films were evaluate. Devices with four different surface areas, each using final organo-metal halide perovskite films produced as described above, were manufactured and tested; 0.12 cm$^2$, 0.3 cm$^2$, 0.6 cm$^2$, and 1.2 cm$^2$. The current density-voltage (J-V) curves obtained from these different devices are shown in FIG. 9A, and their PV parameters are tabulated under the curves. The 1.2 cm$^2$ device reached 15.3% PCE. To check the uniformity of the large area device, EQE was measured at five different areas (four corners and a center) as shown in FIG. 9B. These five EQE curves are almost identical, attesting to the uniformity of the final organo-metal halide perovskite films. The average integrated current density was 21.09 mA/cm$^2$, and agrees very well with the short circuit current ($J_{sc}$) in J-V curve. A group of devices with 10-15 devices for each area category (i.e., 0.12 cm$^2$, 0.3 cm$^2$, 0.6 cm$^2$, and 1.2 cm$^2$) were fabricated in order to disclose the relation between device performance and active area. Their individual PV parameters are summarized in FIG. 9C. $J_{sc}$ was around 21.5 mA/cm$^2$ for devices of different sizes, meaning $J_{sc}$ was essentially independent of device surface area. Open circuit voltage ($V_{oc}$) was between 1.05 V and 1.1 V for most devices regardless of active area, again indicating that $V_{oc}$ was also independent of device surface area. On the other hand, fill factor (FF) decreased with increasing areas. Average FFs were 0.75, 0.71, 0.68, and 0.66 for 0.12 cm$^2$, 0.3 cm$^2$, 0.6 cm$^2$, and 1.2 cm$^2$ respectively. PCE has a similar trend as FF as active area increases, and decreased FF is the loss of PCE for large area devices. In other words, since $J_{sc}$ and $V_{oc}$ are basically independent of area, the PCE and FF have the same dependence on surface area. Thus, the decrease of device efficiency is mainly caused by the lower FF when the device area is increased.

To further determine the underlying mechanism for the lower PCE and FF with increasing active area, series resistances of devices were analyzed from J-V curves using previous reported method. Briefly, from the classic single heterojunction J-V characteristic equations, with the assumption that shunt resistance ($R_{sh}$) is much larger than series resistance ($R_s$), results in equation 1:

$$-\frac{dV}{dJ} = \frac{AK_BT}{e}(J_{sc} - J)^{-1} + R_s \qquad (1)$$

where V is the DC bias applied to the device, J is the current density under the applied bias, A is the ideality factor of a heterojunction, $K_B$ is the Boltzmann constant, T is the absolute temperature, e is the elementary charge, $J_{sc}$ is the short-circuit current density, and $R_s$ is the series resistance. By linear fitting $-dV/dJ$ vs $(J_{sc}-J)^{-1}$ especially for the biases near $V_{oc}$ region, the obtained intercept of line fitting is $R_s$. A typical curve fit is shown in FIG. 10. FIG. 9D illustrates the average and standard deviation of $R_s$ with respect to different areas. $R_s$ monotonically increased as the active area increased, and shows a similar trend as FF and PCE, implying $R_s$ is a limiting factor to determine the device efficiency for large active area perovskite solar cells. The average $R_s$ for 0.12 cm$^2$ devices was only 1.4 Ωcm$^2$, which rose to 5.7 Ωcm$^2$ for the larger 1.2 cm$^2$ devices. $R_s$ may normally be divided into two components: the first representing the active layer, the interfacial layer the current collectors, and the interconnects, which are independent of cell area, and the second representing the transparent anode. Therefore, an area-dependent $R_s$ is mostly due to the transparent anode, and further improvement for large area perovskite may result from the use a transparent conducting oxide (TCO) with a high conductivity and optimized pattern design.

Perovskite solar cells, especially for TiO$_2$ based normal planar structure, possess different J-V characteristics depending on the bias sweeping directions, or so called hysteresis. FIG. 11A illustrates J-V curves, in both scan directions, for the largest device with ~1.2 cm$^2$ active area. The reverse scan (from $V_{oc}$ to 0) shows a ~16.3% efficiency, while the forward scan gives only 12.6° % efficiency. In order to clarify the actual performance of the device, a stabilized power output was monitored over time near the maximum power output point. FIG. 11B shows a ~15.6% stabilized power output, which is close to the reverse scan, for this a large area device. This efficiency level (>15%) was unprecedented for >1 cm$^2$ perovskite solar cells. For a small active area, 0.12 cm$^2$, which is commonly used in the reported perovskite solar cells, a similar hysteresis has been observed as shown in supporting information FIG. 12. FIG. 12A illustrates ~18.32% PCE, based on a reverse scan curve, provided a stabilized power output of about 17.5%, as illustrated in FIG. 12B. This stabilized output power is also among the best reported in literature for planar perovskite solar cells.

Thermally treating room temperature crystallized intermediate organo-metal halide perovskite films, initially crystallized using excess MAI gave rise to final organo-metal halide perovskite films having crystals with large crystal size and a multi-scale uniform film, where multi-scale dimensions have been evaluated on the nano-scale by SEM imaging, on the micro-scale by AFM and TRPL mapping, and on the macro-scale by device level testing (e.g. $J_{sc}$ and $V_{oc}$). Device performances based on this high quality film were analyzed as a function of active area. Over 15% PCE was achieved for the ~1.2 cm$^2$ active area devices, while small area device (0.12 cm$^2$) achieved about ~18.32%. These data show that the anode resistance results in an increasing series resistance, which is responsible for the decrease of FF for devices of large area.

Referring again to FIG. 2, in some embodiments of the present disclosure, the applying 210 may include applying a solution 260 to a substrate 240, where the solution 260 includes a metal halide, a first halogen-containing precursor in a stoichiometric amount relative to the metal halide, and a second halogen-containing precursor. For example, in some embodiments of the present disclosure, a solution 260 may be prepared that includes a first solvent, $PbI_2$ (the metal halide), MAI (the first halogen-containing precursor) at a 1:1 molar ratio relative to the $PbI_2$ (e.g. MAI:$PbI_2$=~1:1), and MACl (the second halogen-containing precursor) at a molar ratio of >0:1 relative to the $PbI_2$ (e.g. MACl:$PbI_2$ is between about 0.01:1 to about 0.5:1.0). Thus, in some embodiments of the present disclosure, the molar ratio of the sum of the first halogen-containing precursor and the second halogen to the metal halide may be greater than one; e.g. the ratio of the moles of MAI+MACl to the moles of $PbI_2$ may be between about 2.0:1.0 and about 1.2:1.0 for (MAI+MACl):$PbI_2$. In some embodiments, as shown below, the use of stoichiometric amounts of a first halogen-containing precursor of MAI, with quantities of a second halogen-containing precursor of MACl resulted in much improved final organo-metal halide perovskite films (e.g. with larger crystal sizes, higher crystallinity, and stronger crystal orientation), even relative to final organo-metal halide perovskite films made using excess amounts of a single halogen-containing precursor (e.g. MAI), in the absence of a second halogen-containing precursor, and better final devices incorporating these films (e.g. higher conversion efficiency and reduced hysteresis).

FIG. 13A illustrates an SEM image of the final organo-metal halide perovskite film resulting from applying a solution having a stoichiometric amount of MAI relative to $PbI_2$ in the absence of MACl, and after solvent-solvent extraction and thermally treating the intermediate film. The crystal size of the final organo-metal halide perovskite crystals making up the organo-metal halide perovskite film, using stoichiometric amounts of MAI, demonstrated average crystal sizes on the order of several hundred nanometers as shown in FIG. 13A. A method utilizing excess MAI, at about 20% on a molar basis, resulted in a final organo-metal halide perovskite film having significantly larger perovskite crystals, again after the applying step, removing step by solvent-solvent extraction, and the thermally treating step, as illustrated in FIG. 2B. Excess MAI promoted crystal growth to average crystal sizes over 1 µm. Finally, FIG. 13C illustrates an SEM image of the final organo-metal halide perovskite film resulting from the use of stoichiometric amounts of a first halogen-containing precursor (MAI) and some amount of a second halogen-containing precursor (MACl). On a molar ratio basis, the molar amounts of reactants used to produce the film illustrated in FIG. 13C were at ratios of about 1.0:0.2:1.0 for MAI:MACl:$PbI_2$. The resultant final organo-metal halide perovskite film made using the "MACl excess" method produced perovskite crystals with the large average crystal sizes, up to about 3 µm. The thicknesses of all of these films were a few hundred nanometers. The UV/Vis absorption spectra of all of the final organo-metal halide perovskite films were quite similar as illustrated in FIG. 13D. However, as illustrated in FIG. 13E, XRD showed a dramatic increase of perovskite peak intensity when using either the "MAI excess" method or the "MACl excess" method compared to the method that used only a stoichiometric amount of MAI. The major perovskite peak (110) located at 14.10 has been enhanced by 3-4 times with the use of the "MAI excess" method and by almost 20 times with the use of the "MACl excess" method. Enhanced peak intensity, generally, is correlated with increased crystallinity and/or more oriented crystals. High crystallinity and more oriented crystals are both expected to improve perovskite solar cell performance.

To further study the change of texture of the final organo-metal halide perovskite films as a result of the different film fabrication methods, a systematic texture analysis technique, pole figure measurement, was conducted. FIG. 14 illustrates two sets of pole figures, namely (110) and (310), for three different samples. The first sample labeled "Stoichiometry" corresponds to a method using a stoichiometric amount of MAI relative to $PbI_2$ (e.g MAI:$PbI_2$=about 1:1) in the starting solution, without any MACl. This sample illustrates a relatively high intensity in the middle of (110) pole figures, but still a considerable amount of intensity spread around other part of circle. The second sample labeled "MAI Excess" corresponds to a method using an excess MAI to $PbI_2$ of about 1.2:1 in the starting solution, without any MACl. This second sample illustrates that the (110) pole figure becomes localized at the middle of circle, indicating most of (110) plane has been rearranged to be parallel to the substrate. However, relatively wide distribution in (310) pole figure shows there are still certain misorientations for (110) planes. Finally, the third sample labeled "MACl Excess" corresponds to a method using a stoichiometric amount of MAI relative to $PbI_2$, with some addition MACl present in the starting solution, such that the relative molar amounts were roughly 1.0:0.2:1.0 for MAI:MACl:$PbI_2$. MACl additive further narrows the center spot of (110) pole figures, and, more interestingly, a very sharp bright yellow ring was formed in (310) pole figure. This feature implies crystals (110) face parallel to substrate ideally while different crystals have random rotations. It should be noted that outside dark ring comes from (222) plane, which has a very similar 2θ value compared to (310) plane.

Devices fabricated using final organo-metal halide perovskite films produced by the three different methods (e.g. "Excess MAI", "Excess MACl", and "Stoichiometric") were also compared. Specifically device performances were correlated to final organo-metal halide perovskite film morphology, crystallinity, and texture, which are summarized below in Table 1. PGPubs, ignore cosmetic shading.

TABLE 1

Device performance statistics for solar cells prepared with "Stoichiometric", "Excess MAI" and "Excess MACl" methods.

|  | Jsc (mA/cm$^2$) | Voc (V) | FF | PCE (%) |
| --- | --- | --- | --- | --- |
| Stoichiometric | 20.70 ± 0.51 | 1.068 ± 0.018 | 0.684 ± 0.041 | 15.10 ± 0.90 |
| MAI excess | 21.89 ± 0.39 | 1.074 ± 0.023 | 0.749 ± 0.019 | 17.51 ± 0.81 |
| MACl excess | 21.92 ± 0.16 | 1.082 ± 0.015 | 0.771 ± 0.010 | 18.28 ± 0.33 |

Table 1 illustrates a distinct jump in fill factor (FF) for devices fabricated using final organo-metal halide perovskite films made by solution methods utilizing "stoichiometric" amounts of MAI without additional MACl, devices fabricated using final organo-metal halide perovskite films made by methods utilizing either to "Excess MAI" without extra MACl, or using "Excess MACl" with stoichiometric amounts of MAI. Power conversion efficiency (PCE) has been boosted from ~15% for "Stoichiometric" conditions to ~17% for "Excess MAI" and ~18% for "Excess MACl".

Typical photocurrent density-voltage (J-V) curves for devices fabricated using final organo-metal halide perovskite films by each of the three film production methods are shown in FIG. 15A, which shows significantly increased FF for methods for fabricating final organo-metal halide perovskite films using either the "Excess MAI" method or the "Excess MACl" method. Other device performance parameters were also improved slightly over the "Stoichiometric" route. EQE spectra are illustrated in FIG. 15B, which agree with Jsc values in J-V curves. Enhanced Jsc with additives comes from whole wavelength improvement.

Since device architecture described herein is a planar structure based on compact TiO$_2$ layer, J-V hysteresis was evaluated. The best performing solar cells devices prepared by the three different final organo-metal halide perovskite films production methods (e.g. "Stoichiometric", "Excess MAI", and "Excess MACl) were evaluated for J-V hysteresis with the results summarized in FIGS. 16A through 16F (both forward scans and reverse scans shown). Hysteresis has been reduced compared to the "Stoichiometric" method, for both of the methods that utilize an excess of halogen-containing precursor (e.g. by the "Excess MAI", method and the "Excess MACl" method), in addition to the improved reverse scan efficiency. Stabilized power output confirms favorable device enhancement results in solar cell devices assembled with final organo-metal halide perovskite films made using methods like the "Excess MAI" and the "Excess MACl" methods, as described herein. However, devices prepared by the "Excess MACl" method generally showed substantially improved stable efficiency output than those prepared using the "Excess MAI" method. This is consistent with the material properties as well as their statistic device characteristics shown in Table 1. It is worth noting that the stabilized power output (~18.5%) of the device utilizing a final organo-metal halide perovskite films made by the "Excess MACl" method is very close to its reverse scan curve (18.6%). These results show that excess methylammonium halide can suppress hysteresis by creating higher quality final organo-metal halide perovskite films.

To understand the defect state with different precursors, time-resolved photoluminescence (TRPL) was measured each of the three different final organo-metal halide perovskite films production methods (e.g. "Stoichiometric", "Excess MAI", and "Excess MACl). As shown in FIG. 17, the lifetime increases relative to the "Stoichiometric" method, with the "Excess MACl" providing the longest. Radiative recombination is significantly suppressed utilizing either of the "Excess MAI" or the "Excess MACl" methods, which is in agreement with the increased device performance and reduced device hysteresis.

EXAMPLES

Organo-Metal Halide Perovskite Film Synthesis Using Excess MAI:

Methylammonium iodide (MAI) was purchased from Dyesol, PbI$_2$ was obtained from Alfa-Aeser, and all the solvents were purchased from Sigma-Aldrich unless it is specified. MAI and PbI$_2$ (MAI:PbI$_2$=1.2:1) were dissolved in 1-Methyl-2-pyrrolidinone (NMP)/γ-Butyrolactone (GBL) (7/3 wt) solvent to form 51.25 wt % precursor solution. Precursor was casted on a substrate and spun at 4500 rpm for about 25 seconds. Obtained substrate was immediately transferred into diethyl ether (DEE, Fisher Chemical) bath for about 90 seconds. After taking out from DEE bath, substrate was dried in air, followed by a thermal annealing on a hotplate with a nominal temperature 150° C. A petri dish was covered on top of the substrate during the heating (15 minutes).

Organo-Metal Halide Perovskite Film Synthesis Using Excess MACl:

Methylammonium iodide (MAI) was purchased from Dyesol, Methylammonium chloride (MACl) was purchased from Sigma-Aldrich, PbI$_2$ was obtained from Alfa-Aeser, and all the solvents were purchased from Sigma-Aldrich unless stated otherwise. Stoichiometric precursor (MAI:PbI$_2$=1:1) was prepared by dissolving MAI and PbI$_2$ (~50 wt %) in a solvent comprising a mixture of 1-N-methyl-2-pyrrolidinone (NMP)/γ-butyrolactone (GBL) (7:3, weight ratio) solvent. For nonstoichiometric precursors, 20% excess organic salt was added, and the final composition are MAI:PbI$_2$=1.2:1 and MACl:MAI:PbI$_2$=0.2:1:1. The precursor was cast on a substrate by spin-coating at 4,500 rpm for about 25 seconds. The substrate was then transferred into a diethyl ether (DEE, Fisher Chemical) bath for about 90 seconds. After taking it out of the DEE bath, the substrate was dried in air, followed by thermal annealing covered under a petri dish on a hotplate at 150° C. for 15 minutes.

Device Fabrication:

Fluorine-doped tin oxide (FTO) substrate (TEC 15, Hartford Glass Co) was patterned using Zinc powder and HCl solution as reported previously. Pre-patterned FTO was thoroughly cleaned and deposited a thin compact TiO2 layer through a spray pyrolysis using 0.2 M titanium diisopropoxide bis(acetylacetonate) in 1-butanol solution at 450° C. TiO$_2$ layer was annealed at 450° C. for 1 h. Perovskite film was deposited using the aforementioned modified SSE method. Hole transport layer (HTL) was spin coated at 4000 rpm for 30 s with a HTL solution, which consists of 80 mg 2,2',7,7'-tetrakis(N,N-dip-methoxyphenylamine)-9,9'-spirobifluorene (Spiro-MeOTAD; Merck, Germany), 30 μl bis (trifluoromethane) sulfonimide lithium salt stock solution (500 mg Li-TFSI in 1 ml acetonitrile), and 30 µl 4-tert-butylpyridine (TBP), and 1 ml chlorobenzene solvent. Finally a 150 nm Ag layer was deposited as a counter electrode using different patterns for different active areas.

Characterizations:

Perovskite crystal structure was measured by XRD using a Rigaku D/Max 2200 with Cu Kα radiation. Absorption spectra were carried out by a UV/Vis spectrometer (Cary-6000i). AFM SEM TRPL (PL mapping) The J-V characteristics of the cells were obtained using a 2400 SourceMeter (Keithley, Cleveland, Ohio) under simulated one-sun AM 1.5G illumination (100 mW cm-2) (Oriel Sol3A Class AAA Solar Simulator, Newport Corporation, Irvine, Calif.). Typical J-V scan started from forward-bias to short-circuit at the rate of 20 mV s-1. A set of masks with 0.12 cm², 0.3 cm², 0.6 cm², and 1.2 cm² areas were used for devices with different areas. External quantum efficiency (EQE) was measured using solar cell quantum efficiency measurement system (QEX10, PV measurements) with a spot size 1 by 5 mm2. Stabilized power output was monitored by a potentiostat (VersaSTAT MC, Princeton Applied Research) near a maximum power output point.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method comprising:
    applying a solution comprising a first solvent, a halogen-containing precursor, and a metal halide to a substrate to form a coating of the solution on the substrate;
    contacting the coating with a second solvent to form a first plurality of organo- metal halide perovskite crystals on the substrate; and
    thermally treating the first plurality of organo-metal halide perovskite crystals, such that at least a portion of the first plurality of organo-metal halide perovskite crystals is converted to a second plurality of organo-metal halide perovskite crystals on the substrate, wherein:
    the halogen-containing precursor consists of a cation and a halide,
    the metal halide consists of a metal and the halide,
    the halogen-containing precursor is provided in the solution in stoichiometric excess,
    the first plurality of organo-metal halide perovskite crystals have an average crystal size between 30 nm and 200 nm,
    the second plurality of organo-metal halide perovskite crystals have an average crystal size between 1 µm and 2 µm, and
    the second plurality of organo-metal halide perovskite crystals consists essentially of the cation, the metal, and the halide.

2. The method of claim 1, wherein the first plurality of organo-metal halide perovskite crystals form as a film on the substrate.

3. The method of claim 1, wherein the first solvent has a boiling point temperature greater than about 150° C.

4. The method of claim 1, wherein the first solvent comprises at least one of 1-methyl-2-pyrrolidinone, γ-butyrolactone, or dimethyl sulfoxide.

5. The method of claim 1, wherein the halogen-containing precursor comprises at least one of a methylammonium halide, a formamidinium halide, or a cesium iodide.

6. The method of claim 5, wherein the methylammonium halide consists of methylammonium iodide (MAI).

7. The method of claim 6, wherein:
    the stoichiometric excess corresponds to a molar ratio of the MAI to the metal halide between greater than about 1.01:1.0 and equal to 2.0:1.0.

8. The method of claim 7, wherein the molar ratio is between 1.2:1.0 and 2.0:1.0.

9. The method of claim 1, wherein the metal halide comprises at least one of $PbI_2$, $SnI_2$, $BiI_3$, or $InI_3$.

10. The method of claim 1, wherein the second solvent has a boiling point temperature below about 150° C.

11. The method of claim 1, wherein the second solvent comprises at least one of diethyl ether, toluene, chlorobenzene, or hexane.

12. The method of claim 1, wherein the applying comprises at least one of spin-coating, curtain-coating, dip-coating, or spraying the solution onto a surface of the substrate.

13. The method of claim 1, wherein the applying is performed at a temperature between about 0° C. and about 35° C.

14. The method of claim 1, wherein the applying is performed over a period of time between about 1 second and about 1 hour.

15. The method of claim 1, wherein the contacting comprises immersing the coating and the substrate in the second solvent.

16. The method of claim 15, wherein the immersing is performed for a period of time between about 30 seconds and about 1 hour.

17. The method of claim 1, wherein the thermally treating comprises heating the first plurality of organo-metal halide perovskite crystals to a temperature between about 35° C. and about 200° C.

18. The method of claim 17, wherein the thermally treating is performed for a period of time between about 5 seconds and about 1 hour.

19. The method of claim 1, wherein the thermally treating is performed in an oxygen-containing environment.

20. The method of claim 1, wherein the second plurality of organo-metal halide perovskite crystals comprises an alkylammonium metal halide crystal.

21. The method of claim 20, wherein the alkylammonium metal halide crystal comprises a methylammonium lead iodide crystal.

* * * * *